United States Patent
Kadan et al.

(10) Patent No.: US 12,027,501 B2
(45) Date of Patent: Jul. 2, 2024

(54) SURFACE LIGHT SOURCE AND METHOD OF MANUFACTURING SURFACE LIGHT SOURCE

(71) Applicant: NICHIA CORPORATION, Anan (JP)

(72) Inventors: Katsuyoshi Kadan, Katsuura-gun (JP); So Sakamaki, Tokushima (JP); Masayuki Eguchi, Tokushima (JP)

(73) Assignee: NICHIA CORPORATION, Anan (JP)

( * ) Notice: Subject to any disclaimer, the term of this patent is extended or adjusted under 35 U.S.C. 154(b) by 160 days.

(21) Appl. No.: 17/219,221

(22) Filed: Mar. 31, 2021

(65) Prior Publication Data
US 2021/0313302 A1  Oct. 7, 2021

(30) Foreign Application Priority Data

Apr. 2, 2020 (JP) .................................. 2020-067099
Jun. 4, 2020 (JP) .................................. 2020-097985
Nov. 9, 2020 (JP) .................................. 2020-186783

(51) Int. Cl.
  *H01L 25/075* (2006.01)
  *H01L 33/62* (2010.01)
(52) U.S. Cl.
  CPC .......... *H01L 25/0753* (2013.01); *H01L 33/62* (2013.01); *H01L 2933/0066* (2013.01)
(58) Field of Classification Search
  CPC ........................... H01L 33/60; H01L 2224/97
  See application file for complete search history.

(56) References Cited

U.S. PATENT DOCUMENTS

| | | | | |
|---|---|---|---|---|
| 2009/0115313 A1* | 5/2009 | Lu | .......................... | H05B 33/10 313/503 |
| 2012/0302124 A1* | 11/2012 | Imazu | .................... | H01L 33/486 445/58 |
| 2012/0305956 A1* | 12/2012 | Liu | .......................... | H01L 33/50 257/E33.061 |
| 2012/0319150 A1* | 12/2012 | Shimomura | ............ | H01L 24/97 257/E33.072 |
| 2013/0187182 A1 | 7/2013 | Muramatsu et al. | | |
| 2013/0236996 A1 | 9/2013 | Chen et al. | | |

(Continued)

FOREIGN PATENT DOCUMENTS

| | | |
|---|---|---|
| JP | H0459167 U | 5/1992 |
| JP | 2000031547 A | 1/2000 |

(Continued)

*Primary Examiner* — Andrew J Coughlin
(74) *Attorney, Agent, or Firm* — Hunton Andrews Kurth LLP

(57) ABSTRACT

A method of manufacturing a surface light source includes providing an intermediate structure body that includes a composite board including a supporting member and a wiring layer disposed on the supporting member and includes a plurality of light-emitting elements disposed apart from each other on the wiring layer of the composite board, disposing a plurality of covering members apart from each other to cover upper surfaces and lateral surfaces of the light-emitting elements and portions of the composite board around the light-emitting elements, disposing a light-shielding member such that a gap between the covering members is filled, removing the covering members to form a plurality of hole portions, and disposing a light-transmissive member in the hole portions.

9 Claims, 23 Drawing Sheets

(56) References Cited

U.S. PATENT DOCUMENTS

| | | | |
|---|---|---|---|
| 2013/0256711 A1* | 10/2013 | Joo | H01L 33/60 |
| | | | 438/28 |
| 2017/0054062 A1 | 2/2017 | Tamaki | |
| 2018/0309034 A1 | 10/2018 | Ooyabu et al. | |
| 2019/0074417 A1* | 3/2019 | Andrews | H01L 24/48 |
| 2019/0123236 A1 | 4/2019 | Matsuda | |

FOREIGN PATENT DOCUMENTS

| | | |
|---|---|---|
| JP | 2004193357 A | 7/2004 |
| JP | 2004335629 A | 11/2004 |
| JP | 2005183718 A | 7/2005 |
| JP | 2006093612 A | 4/2006 |
| JP | 2006100441 A | 4/2006 |
| JP | 2006100444 A | 4/2006 |
| JP | 2007012781 A | 1/2007 |
| JP | 2008124242 A | 5/2008 |
| JP | 2009206228 A | 9/2009 |
| JP | 2012004430 A | 1/2012 |
| JP | 2012124443 A | 6/2012 |
| JP | 2013153068 A | 8/2013 |
| JP | 2013187545 A | 9/2013 |
| JP | 2013247301 A | 12/2013 |
| JP | 2017041579 A | 2/2017 |
| JP | 2017118098 A | 6/2017 |
| JP | 2020021688 A | 2/2020 |
| WO | 2016/148019 A1 | 9/2016 |

\* cited by examiner

SURFACE LIGHT SOURCE AND METHOD OF MANUFACTURING SURFACE LIGHT SOURCE

CROSS-REFERENCE TO RELATED APPLICATION

This application claims priority to Japanese Patent Application No. 2020-067,099 filed on Apr. 2, 2020, Japanese Patent Application No. 2020-097,985 filed on Jun. 4, 2020, and Japanese Patent Application No. 2020-186,783 filed on Nov. 9, 2020, the disclosures of which are hereby incorporated by reference in their entireties.

BACKGROUND

The present disclosure relates to a surface light source and a method of manufacturing the surface light source.

Light-emitting devices including light-emitting elements such as light-emitting diodes are widely used for backlights for liquid-crystal displays and various light sources for displays and the like. For such a light-emitting device, a structure in which a light-emitting element is placed on a board provided with wiring has been proposed. For example, Japanese Patent Publication No. 2006-100444A discloses a light-emitting device in which electrodes on the lower surface of a light-emitting element are connected to wiring on the upper surface of a board.

In a light-emitting device including a large number of such light-emitting elements disposed in a plane, the luminances at positions at which the light-emitting elements are disposed may be locally high in a front view. Hence, a surface light source with a more uniform luminance without being affected by the positions has been demanded.

One object of the present disclosure is to provide a surface light source with reduced unevenness in luminance and a method of manufacturing the surface light source.

SUMMARY

A method of manufacturing a surface light source according to an embodiment of the present disclosure can include providing an intermediate structure body that includes a composite board including a supporting member and a wiring layer disposed on the supporting member and includes a plurality of light-emitting elements disposed apart from each other on the wiring layer of the composite board, disposing a plurality of covering members apart from each other to cover upper surfaces and lateral surfaces of the light-emitting elements and portions of the composite board around the light-emitting elements, disposing a light-shielding member such that a gap between the covering members is filled, removing the covering members to form a plurality of hole portions, and disposing a light-transmissive member in the hole portions.

A surface light source according to another embodiment of the present disclosure can include a composite board including a composite board, a light-shielding member, a plurality of light-emitting elements, and alight-transmissive member. The composite board includes a supporting member and a wiring layer disposed on the supporting member. The light-shielding member is disposed on the composite board, and has a plurality of hole portions. The plurality of light-emitting elements are disposed on the wiring layer in the hole portions of the light-shielding member. The light-transmissive member is disposed in the hole portions and on the light-shielding member.

By a method of manufacturing a surface light source according to an embodiment of the present disclosure, a small-size surface light source including a plurality of light-emitting elements disposed in respective hole portions and separated by a light-shielding member can be obtained. As for a surface light source according to another embodiment of the present disclosure, light emitted from a plurality of light-emitting elements separated by a light-shielding member partially propagates to an adjacent light-emitting region through a light-transmissive member, so that a surface light source with reduced unevenness in luminance and emission closer to surface emission can be obtained.

DETAILED DESCRIPTION

Figure 1:
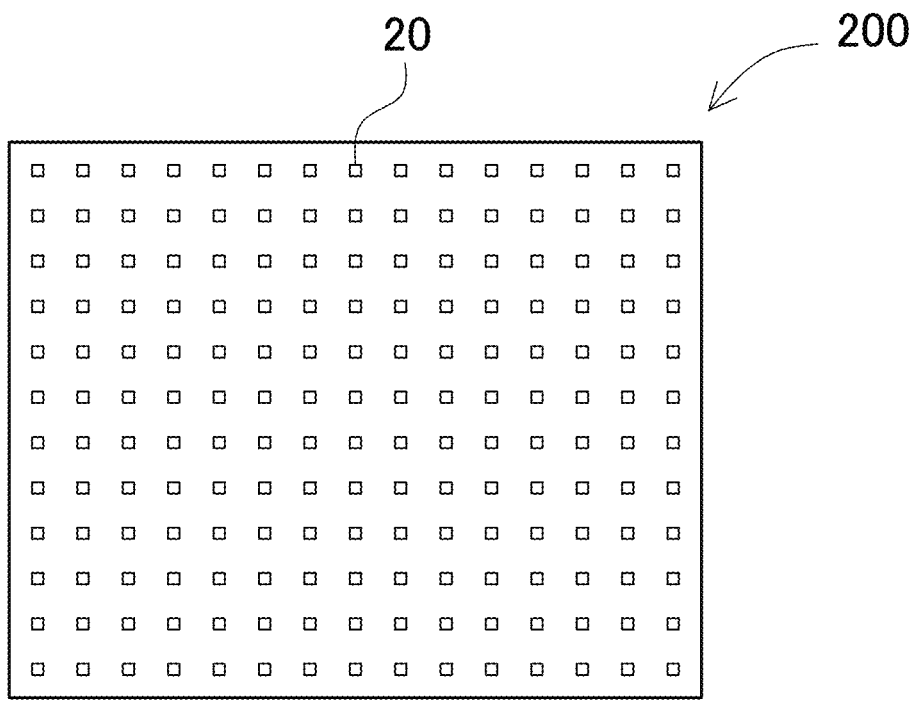
FIG. 1 is a schematic top view of a surface light source according to a first embodiment.

Certain embodiments the present disclosure will be described below in detail with reference to the accompanying drawings. The descriptions below include terms indicating specific directions or positions (for example, "up/upper", "down/lower", and other terms inclusive of these terms) as appropriate. Use of these terms is, however, intended to facilitate understanding of embodiments described above with reference to the drawings, and the meanings of these terms do not limit the technical scope of the present invention. The same reference numeral in a plurality of drawings indicates the same or similar portion or member.

Embodiments described below are intended to describe examples of a method of manufacturing a surface light source in order to give a concrete form to the technical idea of the present invention, and are not intended to limit the present invention to the embodiments described below. Unless specifically stated otherwise, description of sizes, materials, shapes, and relative positions of components described below are not intended to limit the scope of the present invention, but rather to provide examples of certain embodiments of the present invention. Descriptions in a single embodiment or example are applicable to other embodiments and examples. Sizes or positional relationships of members illustrated in the drawings may be exaggerated in order to clarify the descriptions.

First Embodiment

Surface Light Source 100

Figure 2:
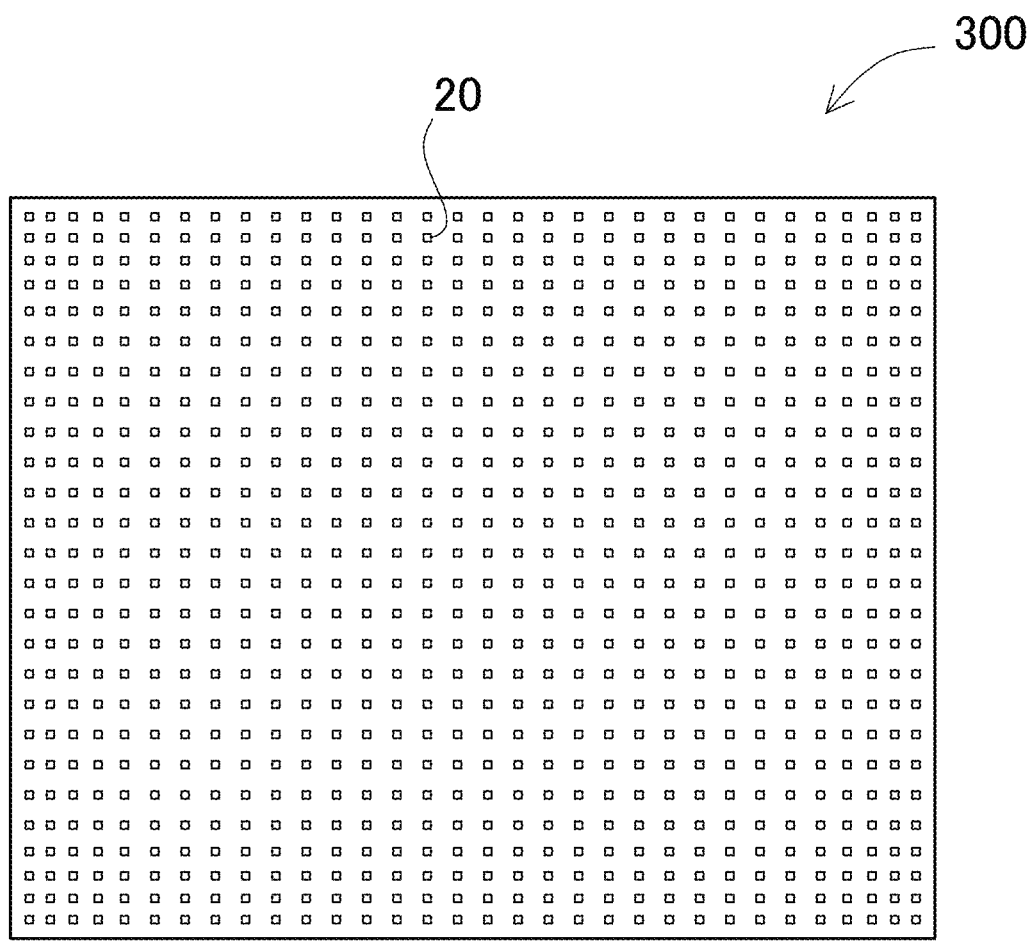
FIG. 2 is a schematic top view of a surface light source according to a modification.

FIG. 1 is a schematic top view of a surface light source 100 according to a first embodiment of the present disclosure. The surface light source 100 shown in FIG. 1 includes a plurality of light-emitting elements 20 disposed in a matrix on a rectangular composite board 50. The number and the disposition of the light-emitting elements are not limited to this example. For example, the intervals between the light-emitting elements can vary from position to position instead of arranging the light-emitting elements at regular intervals. For example, the light-emitting elements 20 can be disposed at uniform intervals on a central portion of the rectangular composite board 50 and can be densely disposed at shorter intervals in the corner portions as shown in FIG. 2. In a constitution including a large number of light-emitting elements, the corners are darker than the central portion. The disposition described above suppresses the corners of the surface light source from being dark and allows for the surface light source 100 with reduced unevenness in luminance as a whole. The light-emitting elements can be arranged two-dimensionally, or each row can be deviated from positions located at uniform intervals. Alternative disposition such as linear, radial, and spiral patterns can be appropriately employed. The number of the light-emitting elements to be disposed, the numbers of the rows and columns, and the like are set according to required specifications such as the size, density, and the amount of light of the surface light source.

Figure 3:
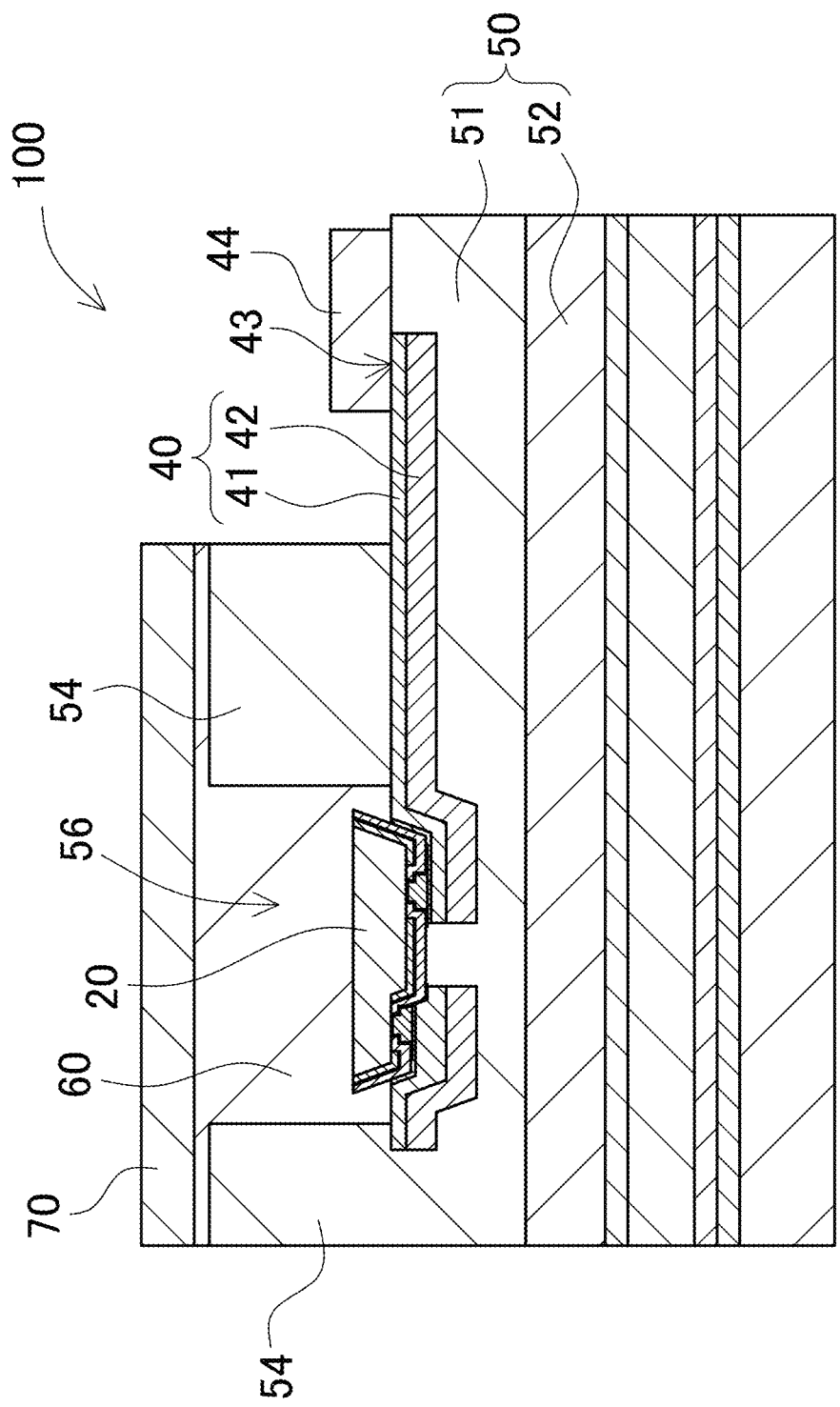
FIG. 3 is a schematic enlarged cross-sectional view of a main part of the surface light source in FIG. 1.

FIG. 3 is a schematic enlarged cross-sectional view of a main part of such a surface light source 100. The surface light source 100 shown in FIG. 3 includes the composite board 50, a light-shielding member 54, the light-emitting elements 20, and a light-transmissive member 60. The composite board 50 includes a supporting member 51 and a wiring layer 40 disposed on the supporting member 51. The light-shielding member 54 is disposed on the composite board 50 and has a plurality of hole portions 56. Each of the hole portions 56 is defined by an inner lateral surface of the light-shielding member 54 and the upper surface of the composite board 50. The bottom surface of the hole portion 56 is defined by the upper surface of the supporting member 51 and the upper surface of the wiring layer 40. In each of the hole portions 56, a respective one of the light-emitting elements 20 is connected to the wiring layer 40. Each member will be described below in detail.

Light-emitting Element 20

The light-emitting elements 20 are disposed on the wiring layer 40 in the hole portions 56 of the light-shielding member 54. The light-emitting element 20 has an electrode formation surface 20a and a light extracting surface 20b opposite to the electrode formation surface 20a. On the electrode formation surface 20a, positive and negative element electrodes 21 are formed. The light-emitting elements 20 are disposed directly on the upper surface of the wiring layer 40 or via bonding members such as bumps interposed therebetween such that the element electrodes 21 face the upper surface of the wiring layer 40.

A semiconductor light-emitting element can be used for the light-emitting element 20. In the present embodiment, a light-emitting diode is taken as an example of the light-emitting element 20. For example, the light-emitting element 20 emits blue light. An element that emits light other than blue light can also be used for the light-emitting element 20. Light-emitting elements that respectively emit different colors of light can be used for a plurality of light-emitting elements 20. The color of at least a portion of light emitted from the light-emitting elements 20 can be adjusted by using a wavelength conversion member 70 before exiting to the outside. In the case in which the surface light source 100 does not include the wavelength conversion member 70, blue light from the light-emitting elements can be emitted as light from the surface light source 100.

Examples of a light-emitting element 20 that emits blue or green light include a light-emitting element including a nitride semiconductor ($In_xAl_yGa_{1-x-y}N$, where $0 \le X$, $0 \le Y$, and $X+Y \le 1$) or GaP. A light-emitting element including a semiconductor such as GaAlAs and AlInGaP can be used for an element that emits red light. Alternatively, semiconductor light-emitting elements made of materials other than the materials described above can be used. The emission wavelengths can be changed by changing the materials for the semiconductor layers and the mixing ratios of the materials. The compositions, emission colors, sizes, and numbers of the light-emitting elements to be used can be appropriately selected according to the purpose.

Such light-emitting elements 20 are two-dimensionally disposed in a plurality of rows and a plurality of columns on the upper surface of the supporting member 51.

Supporting Member 51

The composite board 50 includes the supporting member 51 and the wiring layer 40. The upper surface of the supporting member 51 supports the light-emitting elements 20. The supporting member 51 is suitably formed of a light-reflective resin 51b. The light-reflective resin 51b is preferably formed of a thermosetting resin having good resistance to heat and light. For example, a silicone resin or an epoxy resin can be suitably used. For example, a mixture of a silicone resin and 60% of $TiO_2$, which is a light-reflective filler, can be used. The supporting member 51 has a thickness of, for example, in a range of 15 µm to 300 µm.

Wiring Layer 40

The wiring layer 40 is disposed on the supporting member 51 and electrically connects a plurality of light-emitting elements 20. In the example shown in FIG. 3, the wiring layer 40 has a layered structure of a first metal layer 41 and a second metal layer 42. Examples of the first metal layer 41 include a layered structure of Al/Ti/Cu from the surface closer to the supporting member 51. Examples of the second metal layer 42 include Cu. The first metal layer 41 has a thickness of in a range of 0.1 µm to 1 µm. The second metal layer 42 has a thickness of in a range of 1 µm to 50 µm. The wiring layer 40 can further include a third metal layer and a fourth metal layer.

Figure 4:
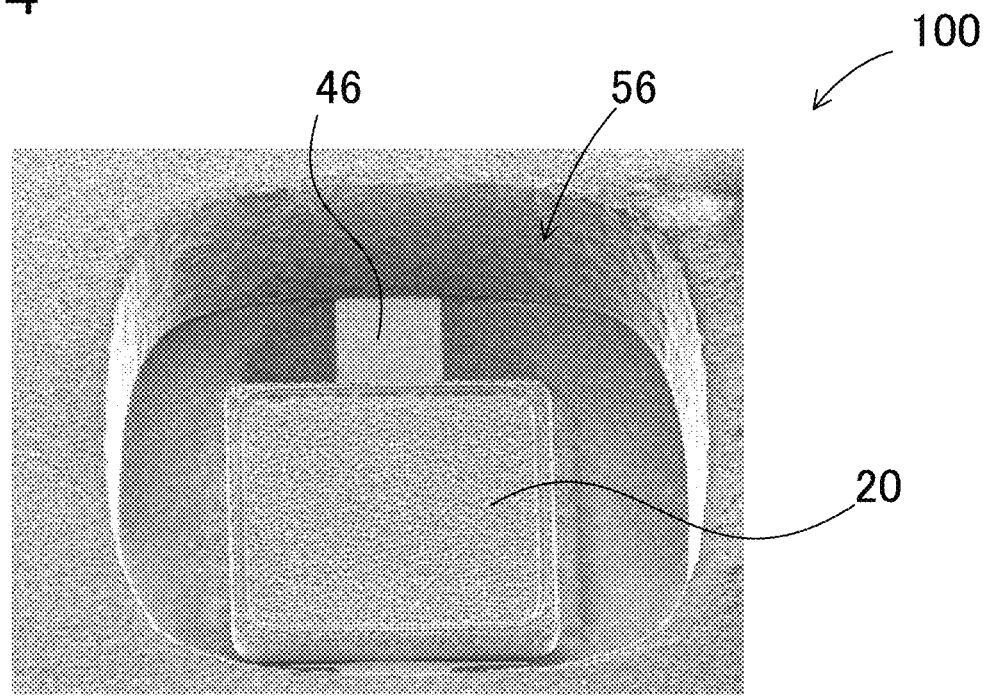
FIG. 4 is a SEM image of a hole portion in a surface light source according to an example.

The wiring layer 40 is exposed in the hole portions 56 of the light-shielding member 54. In other words, the wiring layer 40 exposed at the bottom surfaces of the hole portions 56 is surrounded by the light-shielding member 54. The light-emitting elements 20 are disposed on the wiring layer 40 exposed at the bottom surfaces in the hole portions 56. FIG. 4 is a SEM micrograph of an example of a hole portion 56 in which a light-emitting element 20 has been mounted in a surface light source 100 according to an example.

Figure 5:
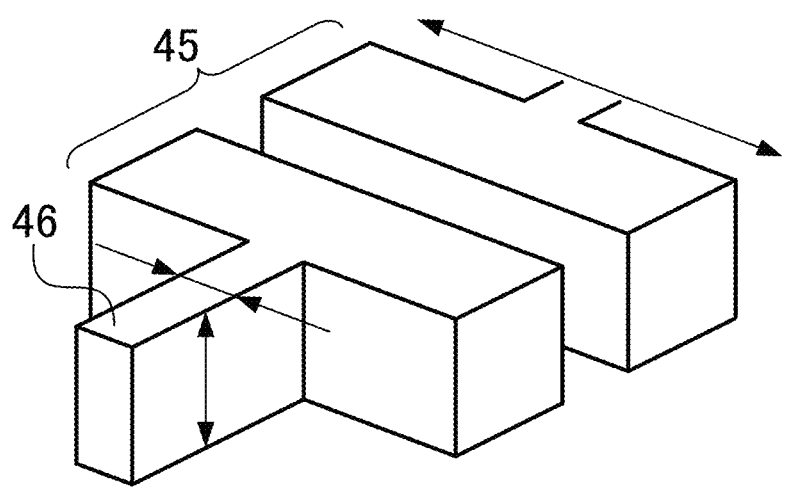
FIG. 5 is a schematic perspective view of a mounting region and an extending region of a wiring layer.

The length of the wiring layer 40 can be smaller than the thickness of the wiring layer 40. FIG. 5 shows a mounting region 45, on which the element electrodes 21 of a light-emitting element 20 are mounted, and an extending region 46, which extends from the mounting region 45, of the wiring layer 40. In FIG. 5, the supporting member 51 is not shown. Allowing the thickness of the extending region 46 of the wiring layer 40 to be larger than the length in the extending direction from the mounting region 45 as shown in FIG. 5 offers advantages in that the electrical resistance is reduced to enhance the electrical conductivity and in that a large area occupied by the supporting member 51 is secured in the region of the bottom surface of the hole portion 56 exposed from the light-emitting element.

The wiring layer 40 can further include a terminal portion 43 in a portion on which the light-emitting element 20 is not mounted. The terminal portion 43 is electrically connected to an external member. For example, the terminal portion 43 is connected to an external member such as a power circuit via a flexible board 44. The flexible board 44 can be bonded by using, for example, an adhesive layer 62 such as solder paste.

Reinforcing Board 52

The composite board 50 can also include a reinforcing board. The reinforcing board is located on the back side of the supporting member 51 and supports the supporting member 51. In the case in which the supporting member 51 is thin, a warp or wrinkle can be formed. On the other hand, reduction in the thickness of a surface light source is strongly demanded. In particular, a thickness of 300 µm or less is demanded for a liquid-crystal display. Accordingly, instead of supporting the light-emitting elements 20 using the supporting member 51 alone, the reinforcing board 52 is also disposed to suppress such a warp, while providing reinforcement. Hence, the reinforcing board 52 functions as a reinforcing layer. This provides the composite board 50 with two separated functions, which are the reinforcement by the reinforcing board 52 and reflection of light by the supporting member 51. The reinforcing board 52 has a thickness of 25 µm to 200 µm. An insulating board is preferably used for the reinforcing board 52 because of its easiness in handling. Suitable examples for the reinforcing board 52 include CS3305A manufactured by Risho Kogyo Co., Ltd. and BN Substrate (trade name) that is polyimide-impregnated glass cloth manufactured by Printec Corporation, which are unlikely to be warped or crinkled. In the case in which a light-reflective member is used for the reinforcing board 52, the supporting member 51 can be omitted.

Light-Shielding Member 54

The light-shielding member 54 is disposed on the composite board 50 and has the hole portions 56. The light-shielding member 54 is formed of a material that blocks light emitted from the light-emitting elements 20. For example, a light-reflective material or a material that absorbs light can be used for the light-shielding member 54. The light-reflective resin 51b can be suitably used. The light-reflective resin 51b is preferably a thermosetting resin having good resistance to heat and light. For example, a silicone resin or an epoxy resin can be suitably used. A black resin can be used for the material that absorbs light. A black-colored resin can also exhibit light-shielding performance. Alternatively, the light-shielding member 54 can be formed of substantially the same material as the material of the supporting member 51. This can allow for good connections between resins when the light-shielding member 54 is disposed on the composite board 50.

The light extraction efficiency can be enhanced by allowing the thickness of the light-shielding member 54 to be 10 µm to 450 µm.

Each of the hole portions 56 of the light-shielding member 54 can have the shape of a circular cylinder, a polygonal prism such as a quadrangular prism and a hexagonal prism, a frustum of a cone, or a frustum of a pyramid.

Light-Transmissive Member 60

The light-transmissive member 60 is disposed in the hole portions 56 and on the light-shielding member 54. Light emitted from respective ones of the light-emitting elements 20 in a plurality of light-emitting regions separated by the light-shielding member 54 partially propagates to an adjacent light-emitting region through the light-transmissive member 60. This may reduce unevenness in luminance of a surface light source.

The light-transmissive member 60 optically couples the wavelength conversion member 70 to the light-emitting elements 20. The light-transmissive member 60 transmits light and fixes the wavelength conversion member 70 and the light-emitting elements 20 in an optically coupled state. A light-transmissive resin such as an epoxy resin, a silicone resin, a mixture of these resins, or glass can be used for the light-transmissive member 60.

Wavelength Conversion Member 70

The wavelength conversion member 70 is disposed over the light-transmissive member 60 and the light-shielding member 54. The wavelength conversion member 70 contains a wavelength conversion substance that converts light emitted from the light-emitting elements 20 into light with a different wavelength.

A sheet in which a wavelength conversion substance is dispersed in a base material can be used for the wavelength conversion member 70. Examples of the wavelength conversion substance include phosphors, such as YAG phosphors, P—SiAlON phosphors, and fluoride phosphors including KSF phosphors. The wavelength conversion member 70 can contain a wavelength conversion substance or a plurality of different wavelength conversion substances. In the case in which the wavelength conversion member 70 contains a plurality of wavelength conversion substances, for example, the wavelength conversion member 70 can contain a P—SiAlON phosphor that emits light having a color in the green range and a fluoride phosphor such as a KSF phosphor that emits light having a color in the red range. This can expand the color reproduction range of the surface light source 100.

For a surface light source that emits light having a color in the red range using a light-emitting element 20 that emits light having a color in the blue range, the wavelength conversion member preferably contains 60 wt % or more, preferably 90 wt % or more, of a KSF phosphor (red phosphor). That is, with the wavelength conversion member containing a wavelength conversion substance that emits light having a specific color, light having a specific color can be emitted. For the wavelength conversion substance, quantum dots can be used. For example, in the wavelength conversion member, the wavelength conversion substance can be substantially uniformly distributed or can be locally distributed. Also, a plurality of layers containing a wavelength conversion substance can be layered.

A resin can be used for the base material in which the wavelength conversion substance is dispersed. A light-transmissive material such as epoxy resins, silicone resins, mixtures of these resins, and glass can be used for the resin material. It is effective to select a silicone resin as the base material in view of resistance to light and ease of formation of the wavelength conversion member 70.

Light-Diffusing Layer

In addition to the wavelength conversion member 70, a light-diffusing layer that diffuses or scatters light emitted from the light-emitting elements 20 can be provided. This structure can suppress local concentration of light at the light extracting surface of the surface light source including a plurality of light-emitting elements 20, so that surface emission with reduced unevenness in luminance may be obtained. The light-diffusing layer is formed by dispersing a light-diffusing material in a resin. Inorganic particles such as $TiO_2$, $SiO_2$, $Al_2O_3$, and a glass filler can be suitably used for the light-diffusing material. For the light-diffusing material, a light-reflective white resin or a metal formed into fine particles can also be used. The light-diffusing material that is randomly distributed in the base material and randomly and repeatedly reflects light passing through the light-diffusing layer to diffuse the light in multiple directions, thereby reducing local concentration of light and suppressing unevenness in luminance at the light extracting surface of the surface light source. A thermosetting resin such as silicone resins and epoxy resins can be suitably used for the resin constituting the light-diffusing layer. The light-diffusing layer desirably has a reflectance of 60% or more, suitably 90% or more, of light emitted from the light-emitting elements 20. The light-diffusing layer can be omitted depending on the constitution and intended use of the surface light source.

Second Embodiment

Each hole portion 56 of the light-shielding member 54 can have a uniform opening width in the thickness direction of the light-shielding member 54 as shown in FIG. 3, or the inner surface of the hole portion 56 can be inclined.

Figure 6:
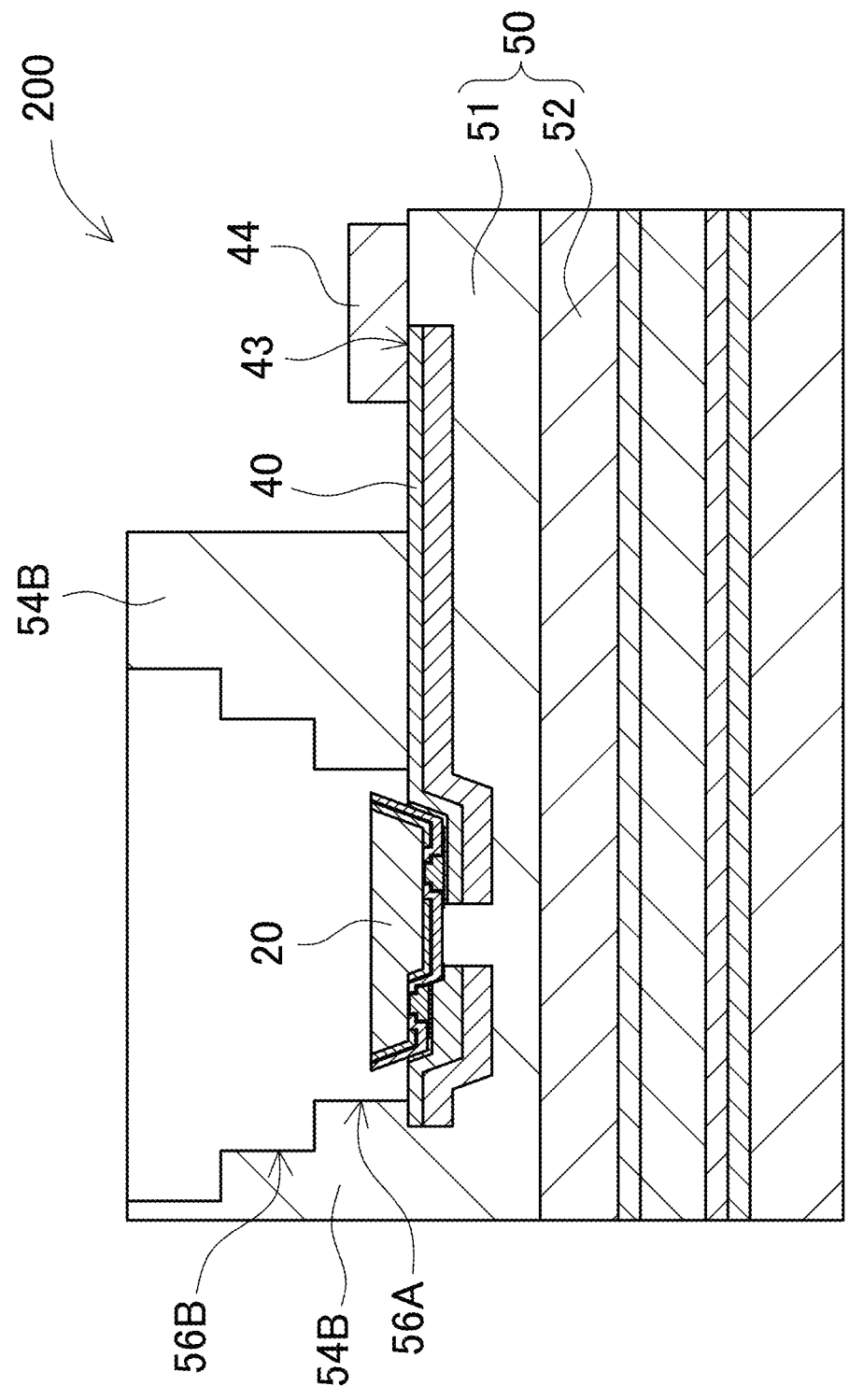
FIG. 6 is a schematic enlarged cross-sectional view of a main part of a surface light source according to a second embodiment.

The inner surface of the hole portion 56 can have one or more stepped portions. As an example of such a constitution, FIG. 6 shows a surface light source 200 according to a second embodiment. The surface light source 200 shown in FIG. 6 has a hole portion 56B having an open end having one or more stepped portions. This constitution can enhance the light extraction efficiency.

Third Embodiment

Figure 7:
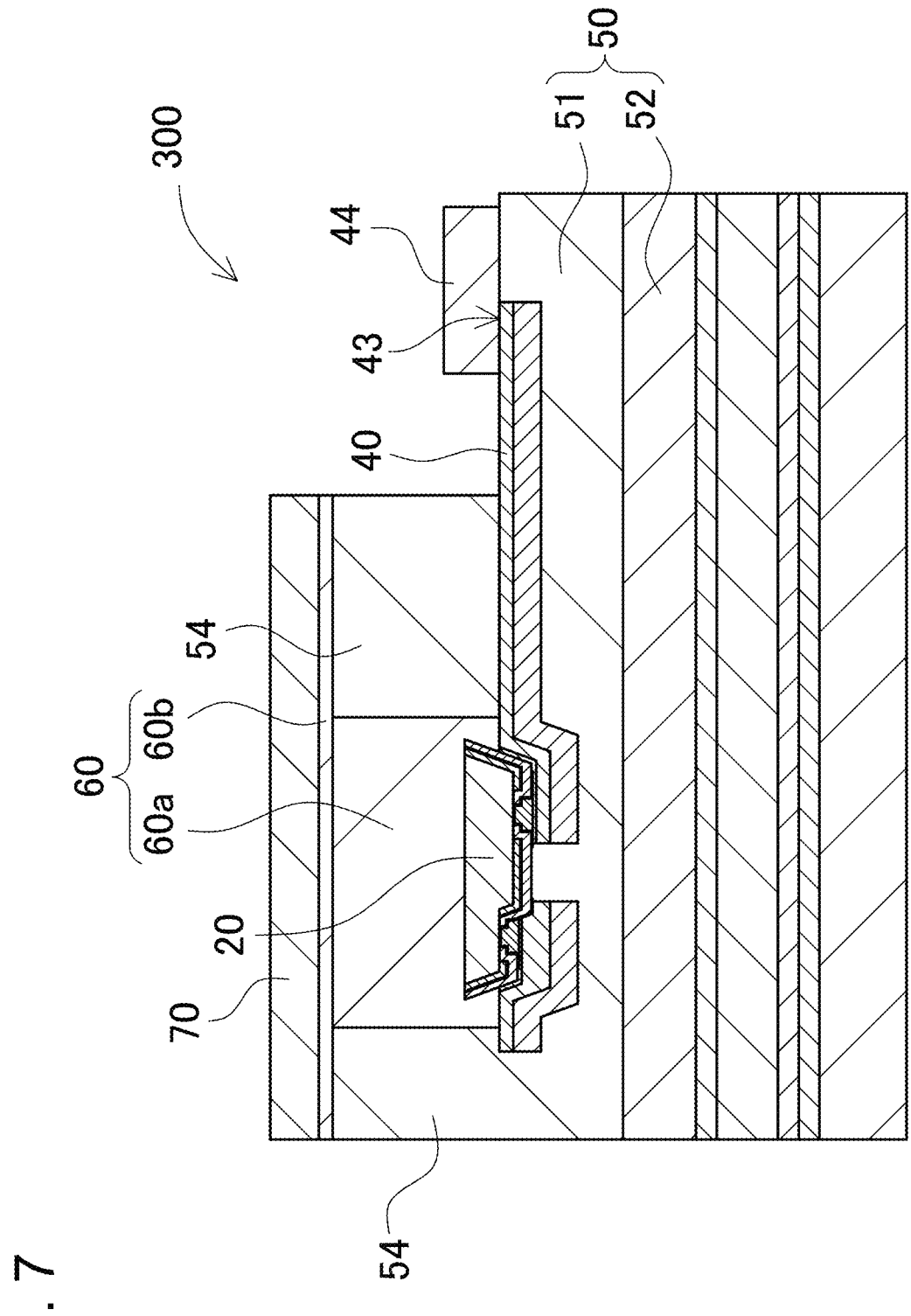
FIG. 7 is a schematic enlarged cross-sectional view of a main part of a surface light source according to a third embodiment.

In the example shown in FIG. 3 described above, the light-transmissive member 60 is disposed on the inner surfaces of the hole portions 56 defined by the light-shielding member 54 and is disposed on the upper surface of the light-shielding member 54, which constitutes the light-transmissive member 60 in an integrated manner. However, the present disclosure is not limited to this constitution, and a plurality of light-transmissive members can be included. As an example of such a constitution, FIG. 7 shows a surface light source 300 according to a third embodiment. In FIG. 7, substantially the same members as members in the above described first and second embodiments are indicated by the same reference numerals, and their detailed descriptions are omitted as appropriate. The light-transmissive member 60 shown in FIG. 7 includes light-transmissive members 60a disposed inside the hole portions 56 defined by a light-shielding member 54C and a light-transmissive member 60b covering the upper surfaces of the light-transmissive members 60a and the light-shielding member 54C. The light-transmissive members 60a and the light-transmissive member 60b are preferably formed of the same material. Different materials having similar refractive indices can also be used.

Method of Manufacturing Surface Light Source

Subsequently, a method of manufacturing a surface light source is described with reference to FIG. 8 to FIG. 28. An intermediate structure body 2 shown in FIG. 21 is first provided.

Providing Intermediate Structure Body 2

Figure 21:
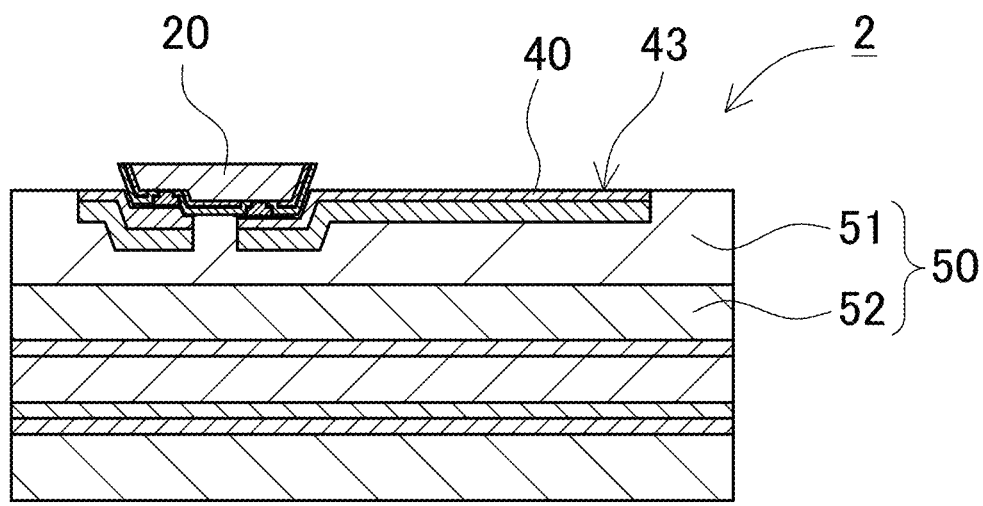
FIG. 21 is a schematic cross-sectional view illustrating a manufacturing process of the surface light source.

The intermediate structure body 2 shown in FIG. 21 includes: the composite board 50 including the supporting member 51 and the wiring layer 40 disposed on the supporting member 51; and the light-emitting elements 20 mounted on the wiring layer 40 of the composite board 50. A step of providing the first intermediate structure body 1 will be described with reference to FIG. 8 to FIG. 16.

Disposing Light-Emitting Elements 20

Figure 8:
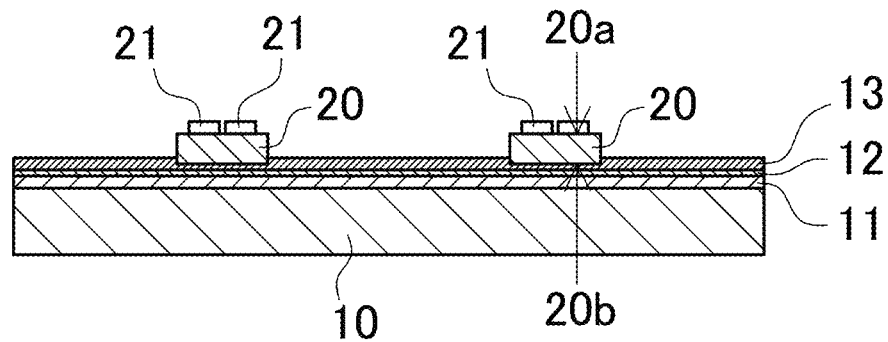
FIG. 8 is a schematic cross-sectional view illustrating a manufacturing process of a surface light source.

The light-emitting elements 20 are disposed on a supporting unit 10 with a second light-transmissive member 13 interposed therebetween as shown in FIG. 8. The light-emitting elements 20 are disposed with the electrode formation surfaces 20a facing up and the light extracting surfaces 20b facing down. The light-emitting elements 20 can be partially embedded in the second light-transmissive member 13. The light extracting surfaces of the light-emitting elements 20 preferably have protrusion and depression.

In the first intermediate structure body 1, the light-emitting elements 20 can be disposed at predetermined intervals. In this case, the element electrodes 21 of the light-emitting elements 20 can be electrically connected through the wiring layer 40 in a step of forming the wiring layer 40 described below.

The supporting unit 10 is a member on which the light-emitting elements 20 can be placed. For example, a glass substrate or a sapphire substrate can be suitably used for the supporting unit 10. For example, a sapphire substrate whose both surfaces (the upper surface and the lower surface) have been polished can be suitably used for the supporting unit 10. The shape of the supporting unit 10 is not limited to particular shapes, but the upper surface is preferably flat. The supporting unit 10 and the light-emitting elements 20 are bonded by using the second light-transmissive member 13. Examples of the second light-transmissive member 13 include VPA manufactured by NIPPON STEEL Chemical & Material Co., Ltd.

A photosensitive resin layer is disposed on the upper surface of the supporting unit 10 as a release layer 11. The second light-transmissive member 13 is disposed on the upper surface of the release layer 11 with a protective layer 12 interposed therebetween. The release layer 11 is used in order to remove the light-emitting elements 20 from the supporting unit 10 by irradiation with light in a subsequent step.

Figure 9:
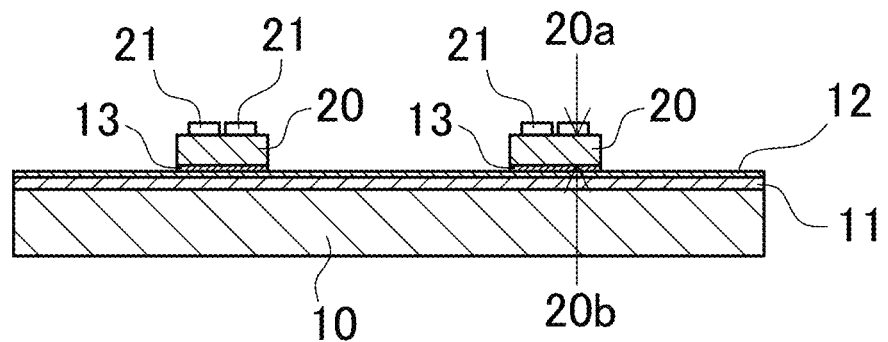
FIG. 9 is a schematic cross-sectional view illustrating a manufacturing process of the surface light source.

Subsequently, the second light-transmissive member 13 is removed by etching except for the regions in which the light-emitting elements 20 are disposed as shown in FIG. 9. Reactive ion etching (RIE) can be suitably employed as the etching. The protective layer 12 suppresses the release layer 11 from being etched. A metal is preferably used for the material of the protective layer 12. Ti can be used for the metal for the protective layer 12.

Forming First Covering Layer 30

Figure 10:
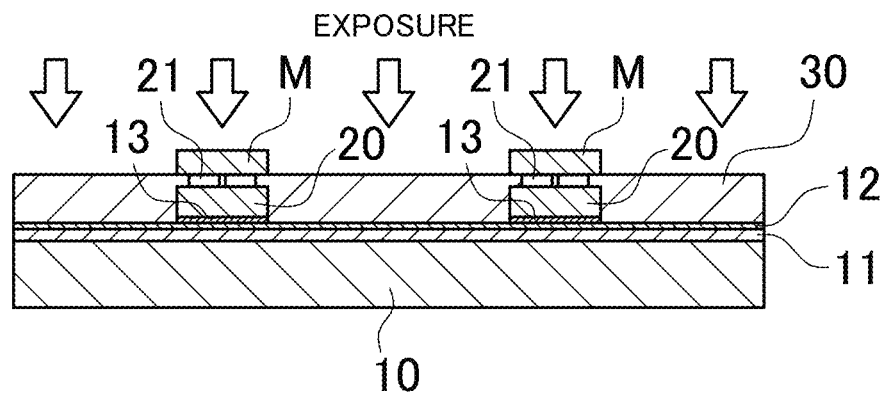
FIG. 10 is a schematic cross-sectional view illustrating a manufacturing process of the surface light source.

Subsequently, a first covering layer 30 is formed around the light-emitting elements 20 on the supporting unit 10 as shown in FIG. 10. A material for the first covering layer 30 is applied to the supporting unit 10 to form the first covering layer 30. The application method is not limited to particular methods, and examples thereof include spin coating using a spin coater and discharging using a dispenser. A member constituted of an organic matter is preferably used for the first covering layer 30. Accordingly, the first covering layer 30 can be easily removed by etching in a step of removing the first covering layer 30 described below. Examples of the organic matter include a polyimide (PI) and an acrylic resin.

Figure 11:
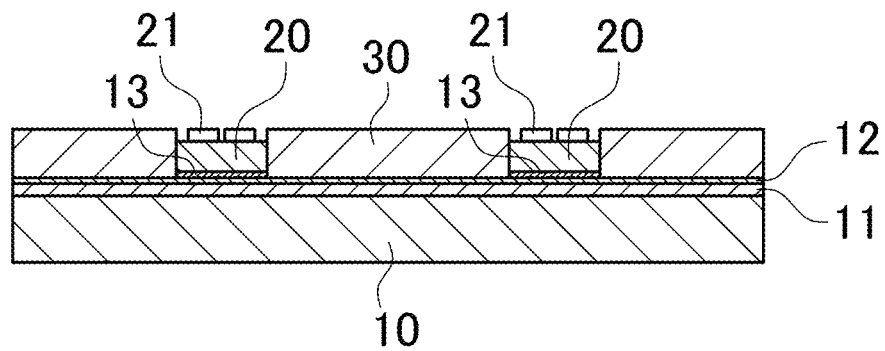
FIG. 11 is a schematic cross-sectional view illustrating a manufacturing process of the surface light source.

In the case in which a resist is used for the first covering layer 30, the resist is disposed to cover the supporting unit 10 and the light-emitting elements 20 and then exposed to light through masks M covering portions above the light-emitting elements 20 as shown in FIG. 10, and development is performed. This operation forms openings in which the electrode formation surfaces 20a of the light-emitting elements 20 are exposed as shown in FIG. 11. The example shown in FIG. 10 and FIG. 11 is what is called a negative type, in which exposed portions are left after exposure and development, but a positive resist, in which exposed portions are removed after exposure and development, can be used. A material mainly composed of a polyimide or an acrylic resin can be used for such a resist.

Forming Wiring Layer 40

Subsequently, the wiring layer 40 is formed over the element electrodes 21 of the light-emitting elements 20 and the first covering layer 30. The wiring layer 40 is formed by layering the first metal layer 41 and the second metal layer 42.

Figure 12:
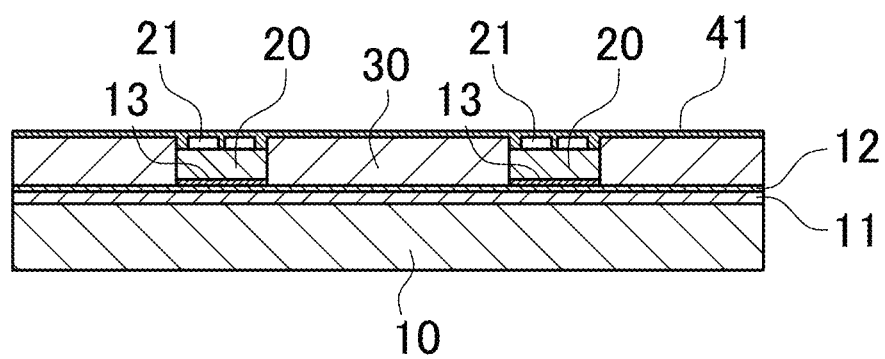
FIG. 12 is a schematic cross-sectional view illustrating a manufacturing process of the surface light source.

In the step of forming the wiring layer 40, the first metal layer 41 is formed on substantially the entire surfaces of the element electrodes 21 of the light-emitting elements 20 and the first covering layer 30 by sputtering or the like as shown in FIG. 12. The first metal layer 41 is used for a seed layer for formation of the second metal layer 42 by electroplating in a step of forming the second metal layer 42, which is a subsequent step. Examples of the layered structure of the first metal layer 41 include Al/Ti from the supporting unit 10 side.

Figure 13:
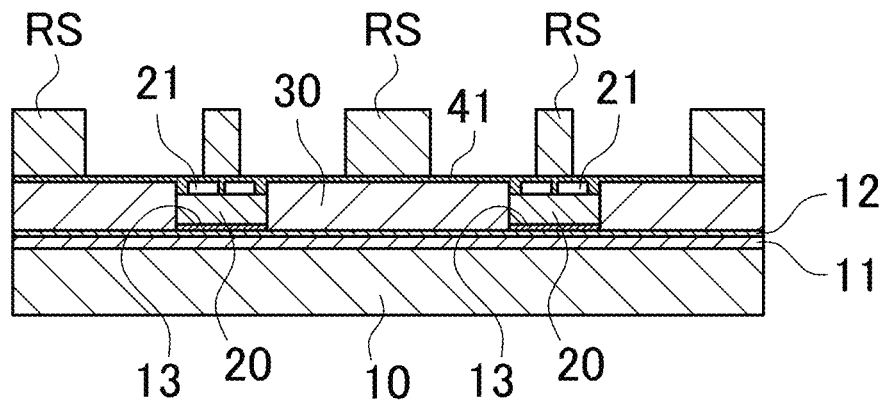
FIG. 13 is a schematic cross-sectional view illustrating a manufacturing process of the surface light source.

Subsequently, a resist RS is formed over the first metal layer 41 as shown in FIG. 13. The resist RS has a plurality of openings. The openings of the resist RS at least partially overlap with the element electrodes 21 in a top view. The openings of the resist RS are larger than the element electrodes 21 in a top view. The interval between openings of the resist RS above a single light-emitting element 20 is larger than the interval between the positive and negative element electrodes.

Figure 14:
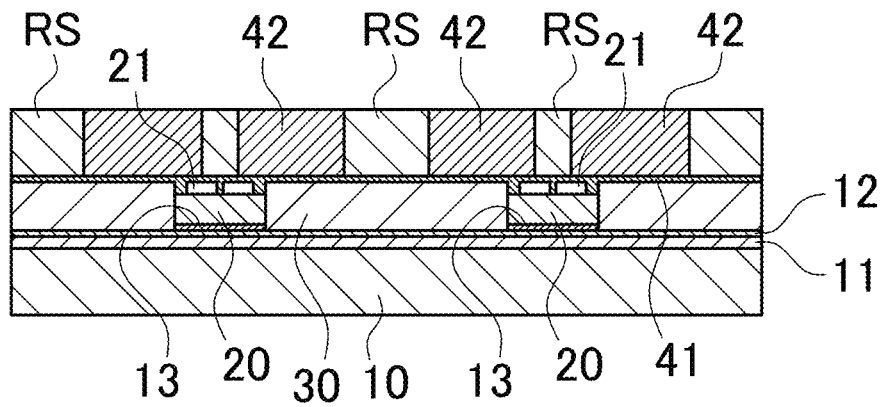
FIG. 14 is a schematic cross-sectional view illustrating a manufacturing process of the surface light source.

Subsequently, the second metal layer 42 is formed by electroplating inside the openings of the resist RS as shown in FIG. 14. The second metal layer 42 is formed by plating growth in the openings of the resist RS using the first metal layer 41 as the seed layer, or the current path, for electroplating. Examples of the second metal layer 42 include Cu.

Figure 15:
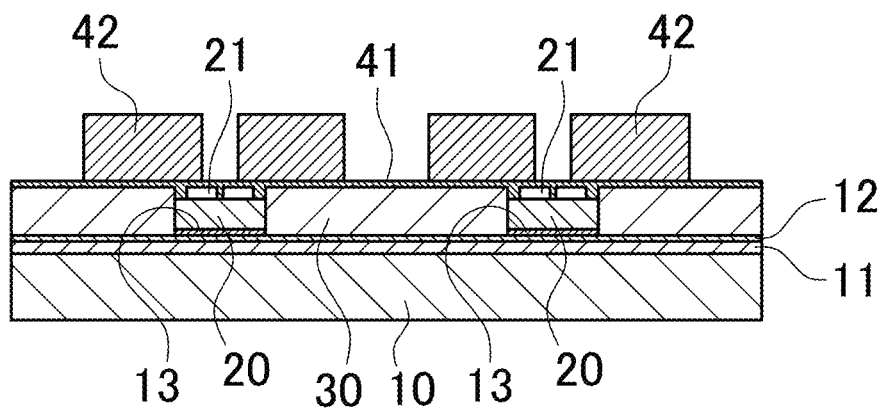
FIG. 15 is a schematic cross-sectional view illustrating a manufacturing process of the surface light source.

Subsequently, the resist RS is removed as shown in FIG. 15. The second metal layer 42 is thus formed as part of the wiring layer 40.

Figure 16:
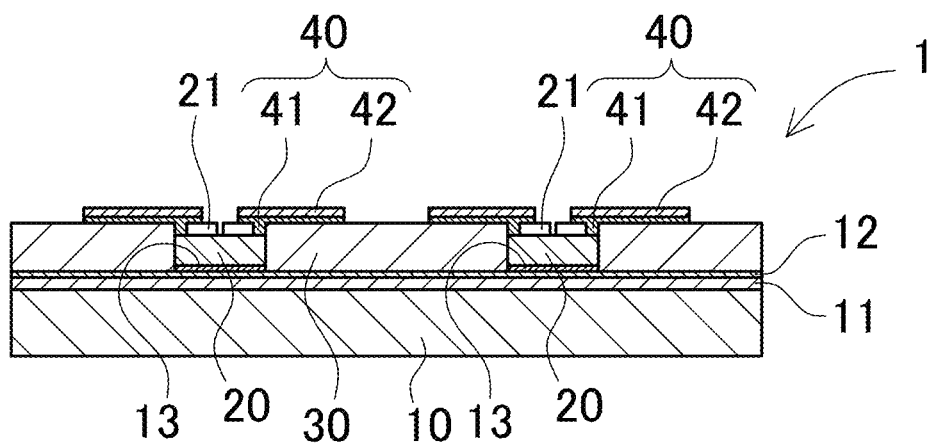
FIG. 16 is a schematic cross-sectional view illustrating a manufacturing process of the surface light source.

Etching is then performed to partially remove the second metal layer 42 to reduce the thickness of the second metal layer 42 and to remove the first metal layer 41 in the regions not provided with the second metal layer 42 as shown in FIG. 16. Removing a portion of the second metal layer 42 and a portion of the first metal layer 41 at the same time can allow for etching without a mask. The wiring layer 40 in which the first metal layer 41 and the second metal layer 42 are layered is thus formed over the element electrodes 21 of the light-emitting elements 20 and the first covering layer 30. In the case in which the second metal layer 42 formed in the step of forming the second metal layer 42 is thin, the step of reducing the thickness of the second metal layer 42 can be omitted. In this case, a step of removing the first metal layer 41 in the regions not provided with the second metal layer 42 can be performed before or after the step of forming the second metal layer 42. A third metal layer and a fourth metal layer can be further layered on the wiring layer 40 to form a second wiring layer.

The wiring layer 40 is formed on the basis of the element electrodes 21 of the light-emitting elements 20. Therefore, the position of the wiring layer 40 can be adjusted even if the light-emitting elements 20 are misaligned in the step of disposing the light-emitting elements 20. This can suppress poor connections caused by misalignment between the element electrodes 21 of the light-emitting elements 20 and the wiring layer 40 compared with the case in which the light-emitting elements are disposed on the basis of the wiring layer on the board.

The first intermediate structure body 1 is provided as described above. Such a first intermediate structure body 1 can be provided by purchasing or by performing part or the whole of the step of providing the first intermediate structure body 1.

Figure 17:
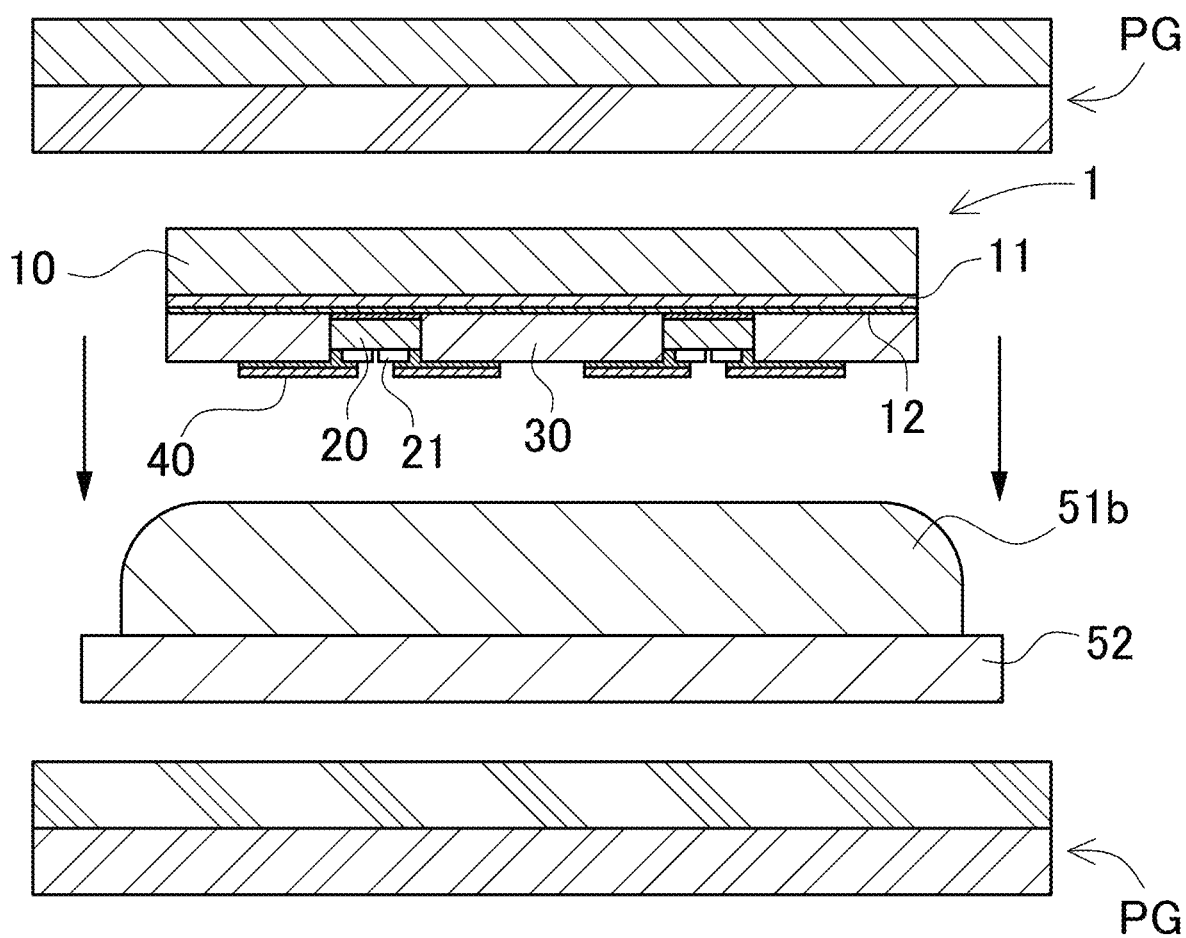
FIG. 17 is a schematic cross-sectional view illustrating a manufacturing process of the surface light source.

While the first intermediate structure body 1 is provided, the reinforcing board 52 to which the light-reflective resin 51b has been applied is provided. The first intermediate structure body 1 is turned upside down and pressed against the light-reflective resin 51b with the wiring layer 40 facing the light-reflective resin 51b as shown in FIG. 17. In the present example, the first intermediate structure body 1 is bonded using the light-reflective resin 51b to a wafer such as a glass base substrate provided with a release sheet on the upper surface of the wafer and the reinforcing board 52 such as BN Substrate placed on the wafer. The bonding is preferably performed by pressing in a vacuum. The supporting member 51 and the reinforcing board 52 can therefore be bonded to the first intermediate structure body 1 at once, so that a warp or wrinkle can be reduced even in the case in which the supporting member 51 is thin. In the present example, the first intermediate structure body 1 is pressed against the light-reflective resin 51b in an uncured or semi-cured state. As used in the present specification, the term "semi-cured" refers to a state where curing of the resin is stopped at an intermediate stage, and the expression "the light-reflective resin in a semi-cured state" refers to the light-reflective resin in a state in which further curing can proceed from that state by heating in the curing process. By using the light-reflective resin 51b in an uncured or semi-cured state, the lateral surfaces and the lower surface of the wiring layer 40 (surface opposite to the surface facing the first covering layer 30) can be covered with the supporting member 51. In the example shown in FIG. 17, glass substrates are used for pressing. These glass substrates PG for pressing are preferably provided with PET release sheets on the surfaces of the glass substrates PG.

Figure 18:
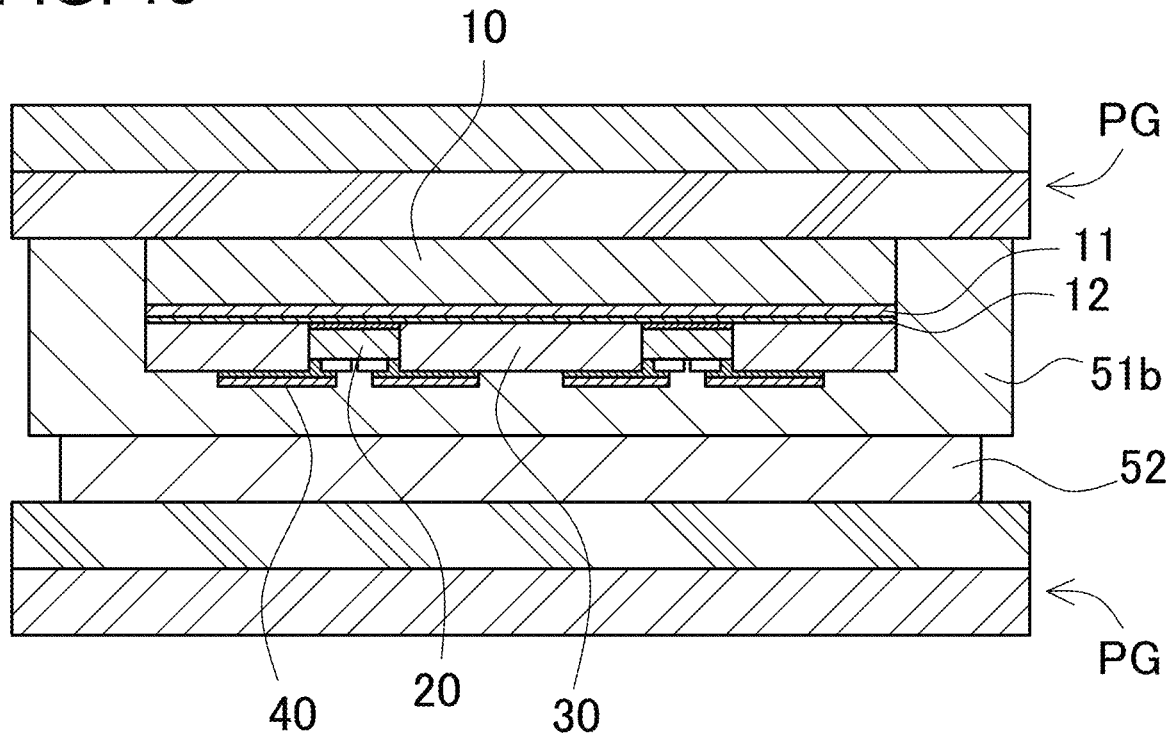
FIG. 18 is a schematic cross-sectional view illustrating a manufacturing process of the surface light source.
Figure 19:
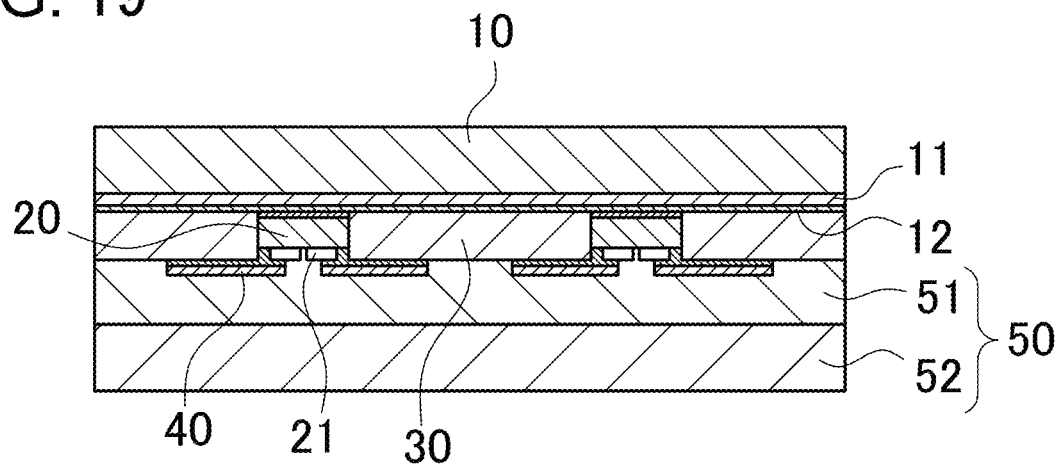
FIG. 19 is a schematic cross-sectional view illustrating a manufacturing process of the surface light source.

Subsequently, the light-reflective resin 51b is cured to form the supporting member 51. The light-reflective resin 51b is cured while being pressed as shown in FIG. 18. Heating is performed on the light-reflective resin 51b, which is a thermosetting resin such as a silicone resin as described above. For example, heating is performed at 150° C. for several hours. The glass substrates PG for pressing are removed, and excess portions of the light-reflective resin and the like are removed as shown in FIG. 19. The light-reflective resin 51b has been applied to the reinforcing board 52 in this example. Conversely, it is also possible to apply the light-reflective resin 51b to the first intermediate structure body 1 and then bond the reinforcing board 52 to the light-reflective resin 51b.

Figure 20:
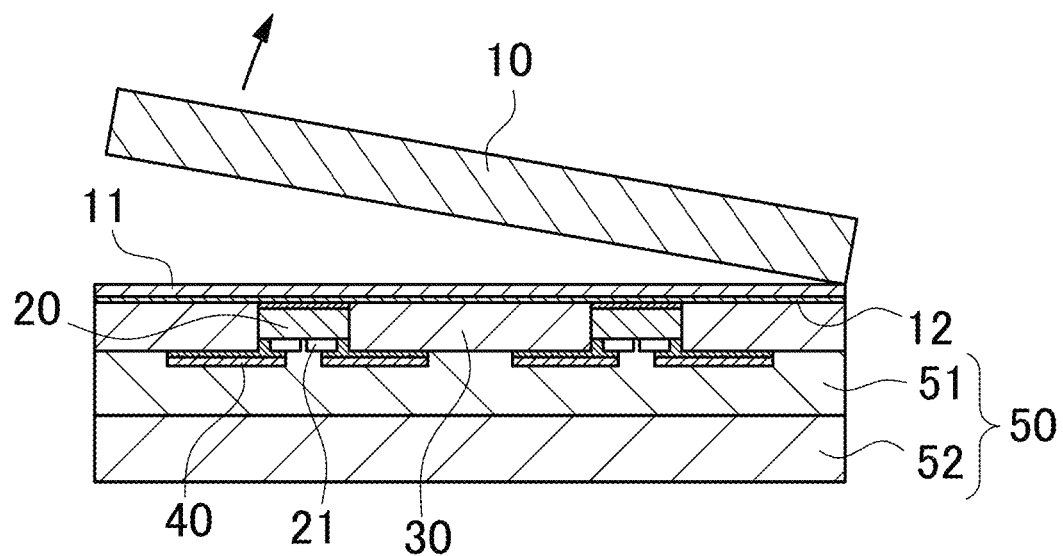
FIG. 20 is a schematic cross-sectional view illustrating a manufacturing process of the surface light source.

Subsequently, the supporting unit 10 is removed as shown in FIG. 20. The supporting unit 10 can be removed by laser lift off or the like. In order to facilitate detachment of the supporting unit 10, the release layer 11 has been disposed on the supporting unit 10.

Unnecessary portions, in addition to the release layer 11, are also removed. In the present example, the first covering layer 30 formed of the polyimide resin is removed by RIE as shown in FIG. 21. The intermediate structure body 2 in which a plurality of light-emitting elements 20 are disposed on the composite board 50 is obtained in this way. Such an intermediate structure body 2 can be provided by purchasing or by performing part or the whole of the step of providing an intermediate structure body 2.

Disposing Covering Members 31

Figure 22:
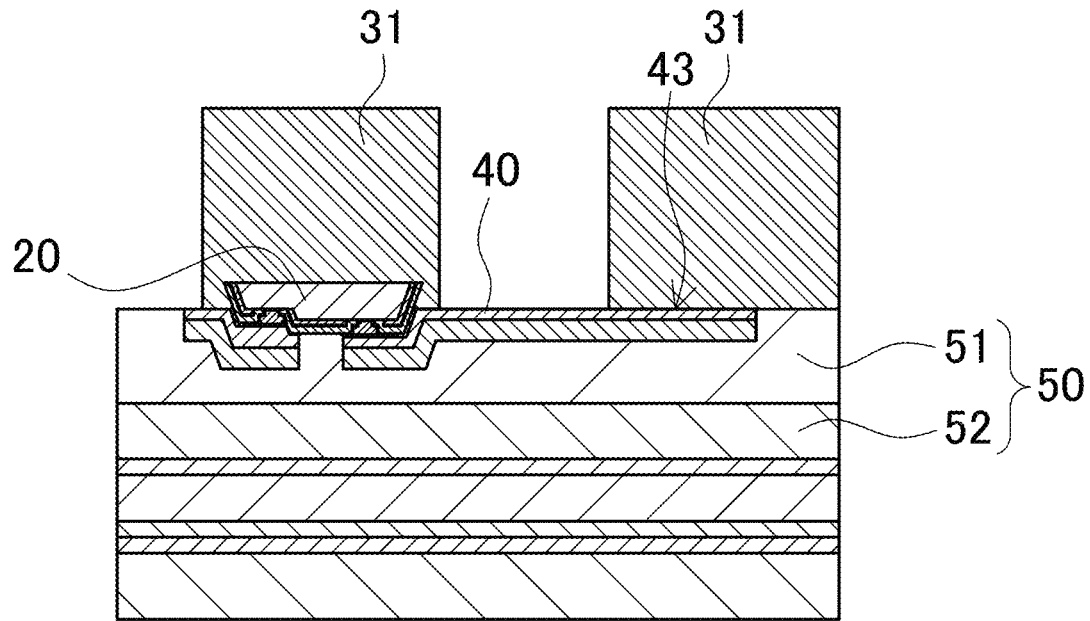
FIG. 22 is a schematic cross-sectional view illustrating a manufacturing process of the surface light source.
Figure 23:
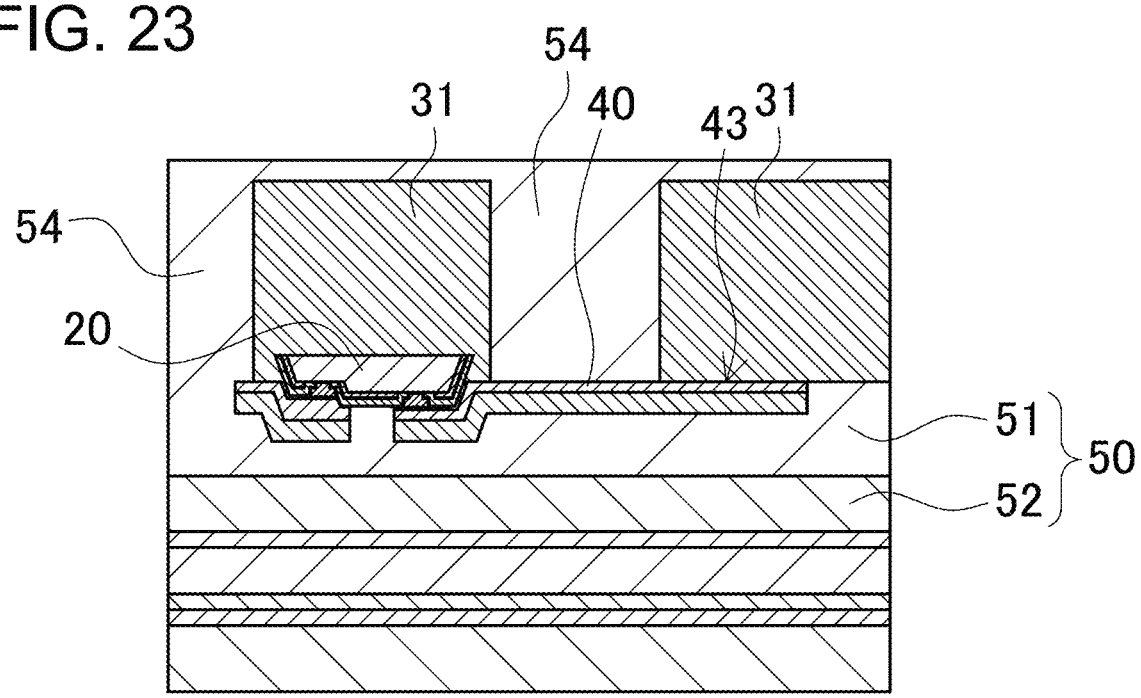
FIG. 23 is a schematic cross-sectional view illustrating a manufacturing process of the surface light source.

A plurality of covering members 31 are positioned apart from each other on the intermediate structure body 2 obtained in this way as shown in FIG. 22. Each of the covering members 31 is disposed to cover the upper surface and lateral surfaces of the light-emitting element 20 and a portion of the composite board 50 around the light-emitting element 20. A resist can be suitably used for the covering member 31. An acrylic resin can be used for the material of the resist. The material of the resist in an unhardened state is applied to the upper surface of the composite board 50 such that the light-emitting element 20 is embedded, and then the material is cured, so that the covering member 31 is formed.

The covering member 31 can have the shape of a circular cylinder, a polygonal prism such as a quadrangular prism and a hexagonal prism, a frustum of a cone, or a frustum of a pyramid. The light-emitting element 20 is preferably located at the center of the covering member 31 in a top view.

The covering member 31 is disposed on the upper surface of the wiring layer 40 to also cover the terminal portion 43 connected to an external member.

Disposing Light-Shielding Member

The light-shielding member 54 is disposed such that the gaps between the covering members 31 formed as described above are filled. In the example shown in FIG. 23, the light-shielding member 54 covers the upper surfaces of the covering members 31 continuously from the gaps between the covering members 31. However, the light-shielding member 54 can be substantially flush with the covering members 31. A resin containing a light-reflective substance is used for the light-shielding member 54. For example, an uncured silicone resin can be supplied into the gaps between the covering members 31 and cured to form the light-shielding member surrounding the covering members 31.

Exposing Covering Members 31

Figure 24:
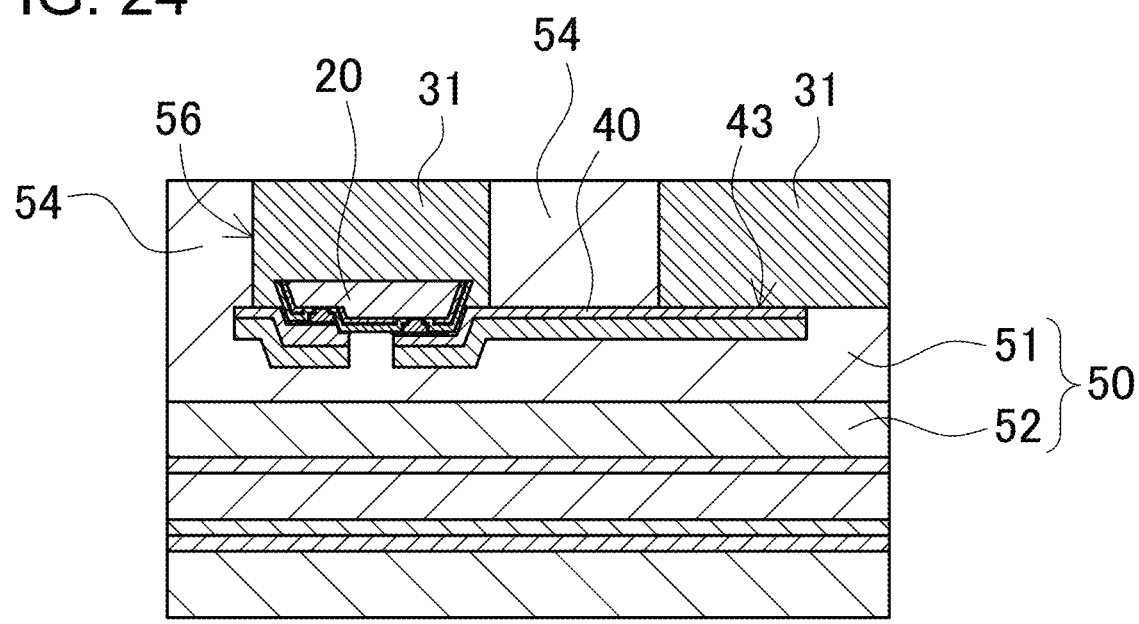
FIG. 24 is a schematic cross-sectional view illustrating a manufacturing process of the surface light source.

Subsequently, the surface of the light-shielding member 54 is partially removed to expose the covering members 31 as shown in FIG. 24. For example, machining is performed from the upper surface of the light-shielding member 54 until the covering members 31 are exposed from the light-shielding member 54. This operation offers an advantage in that the upper surface of the light-shielding member 54 can be flat. The step of exposing the covering members 31 can be omitted in the case in which the light-shielding member 54 is formed to be substantially flush with the covering members 31, and the upper surfaces of the covering members 31 are not covered in the step of disposing the light-shielding member 54.

Removing Covering Members 31

Figure 25:
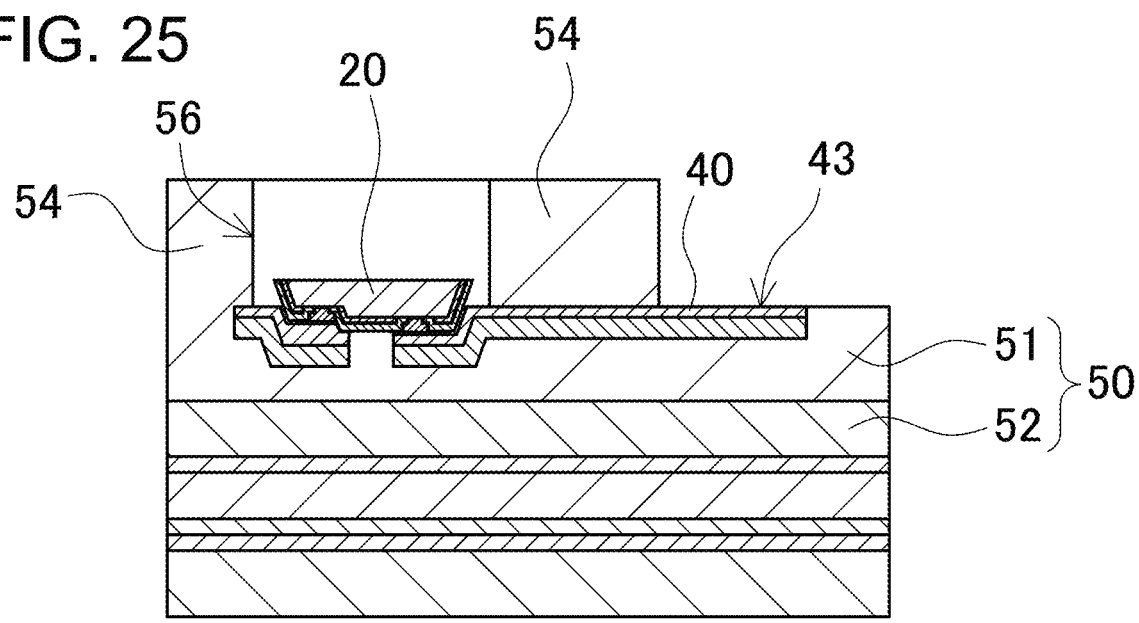
FIG. 25 is a schematic cross-sectional view illustrating a manufacturing process of the surface light source.

Further, the covering members 31 are removed to form a plurality of hole portions 56 surrounded by the light-shielding member 54 as shown in FIG. 25. The covering members 31 are removed by, for example, dry etching.

Disposing Light-Transmissive Member 60

Figure 26:
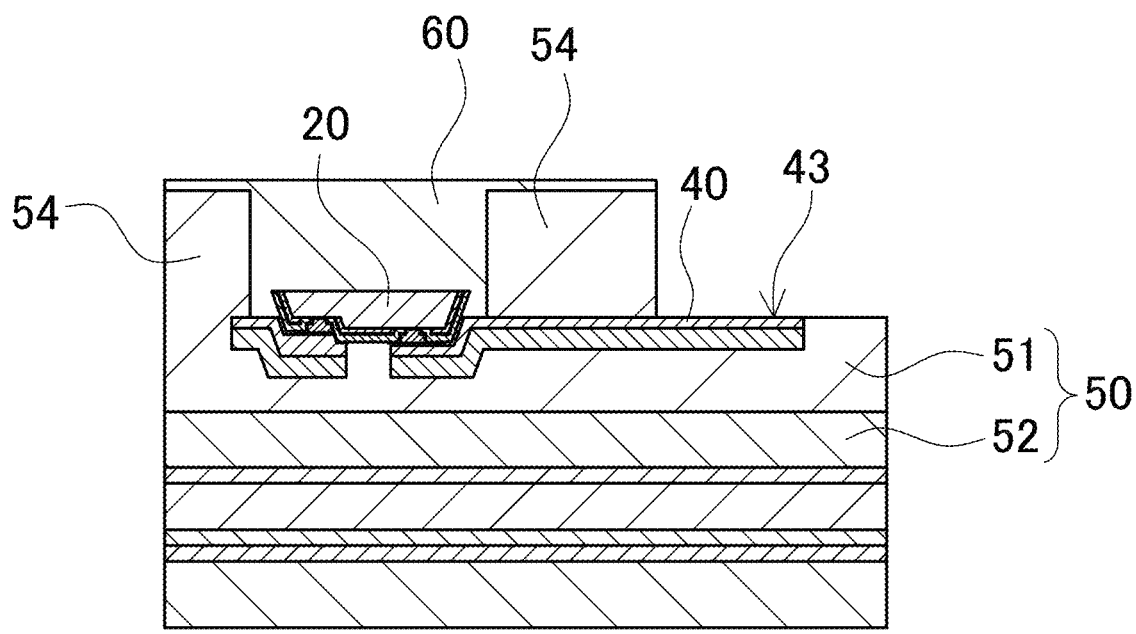
FIG. 26 is a schematic cross-sectional view illustrating a manufacturing process of the surface light source.
Figure 27:
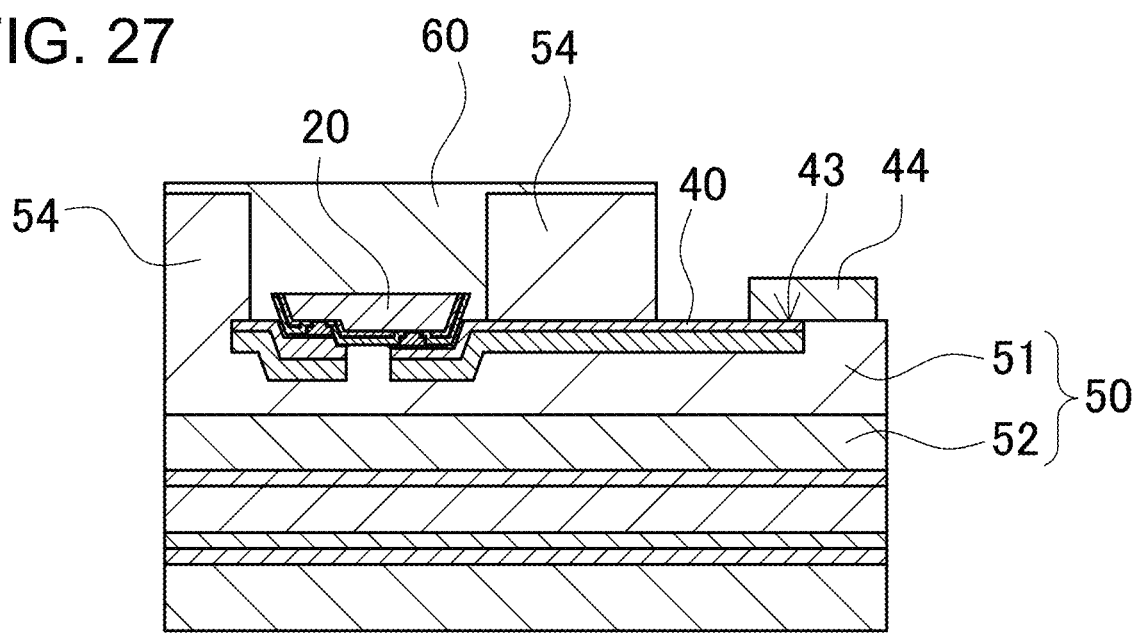
FIG. 27 is a schematic cross-sectional view illustrating a manufacturing process of the surface light source.

The light-transmissive member 60 is disposed in the hole portions 56. In the present example, the light-transmissive member 60 is provided such that the hole portions 56 are filled and the upper surface of the light-shielding member 54 is embedded in the light-transmissive member 60 as shown in FIG. 26. For the light-transmissive member, a thermosetting resin such as a silicone resin can be used. This can allow light emitted from the light-emitting elements 20 separated by the light-shielding member 54 to partially propagate to the adjacent light-emitting region through the light-transmissive member 60, so that a surface light source with reduced unevenness in luminance and emission closer to surface emission can be obtained.

Performing Required Wiring for Terminal Portion 43 of Wiring Layer 40

Further, required wiring for the terminal portion 43 of the wiring layer 40 is performed. In the example shown in FIG. 27, the flexible board 44 is connected to the terminal portion 43.

As described above, a small surface light source including a plurality of light-emitting elements 20 disposed in the hole portions 56 and separated by the light-shielding member 54 can be obtained.

Disposing Wavelength Conversion Member 70

Further, the wavelength conversion member 70 can be disposed over the light-transmissive member 60 and the light-shielding member 54. The wavelength conversion member 70 disposed converts light emitted from the light-emitting elements 20 into light with a different wavelength, and the mixture of light having those colors can be emitted. For example, a surface light source that can emit white light can be obtained by using blue light-emitting diodes for the light-emitting elements and using a YAG phosphor that is excited by blue light to produce yellow fluorescence for the wavelength conversion member 70.

Figure 28:
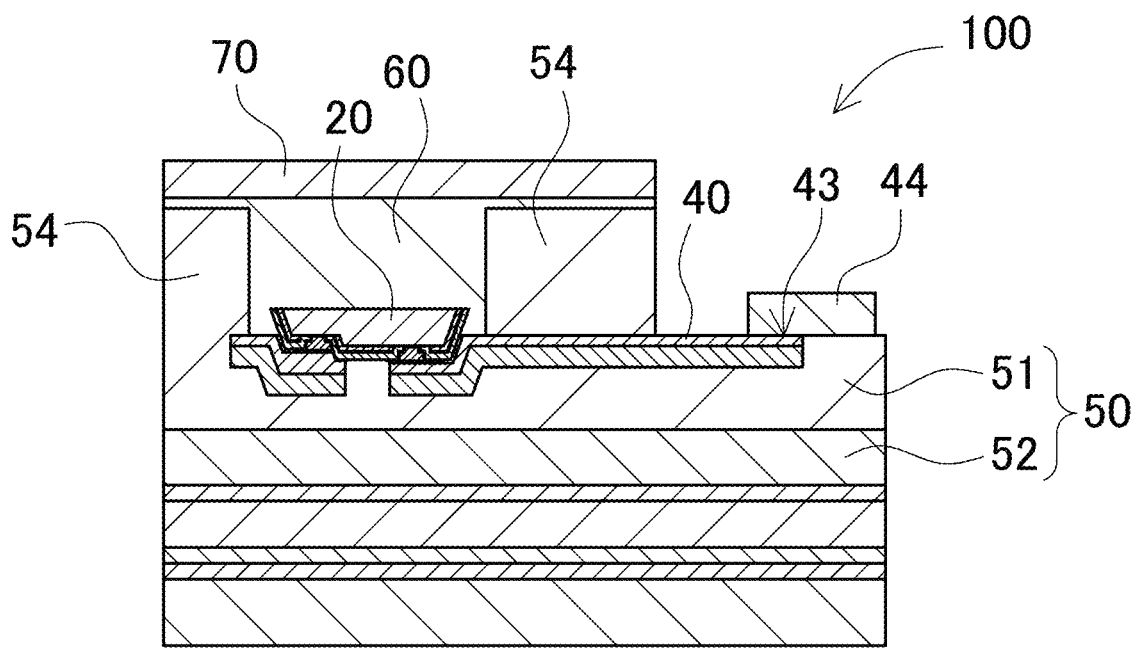
FIG. 28 is a schematic cross-sectional view illustrating a manufacturing process of the surface light source.

In order to dispose the wavelength conversion member 70, for example, the wavelength conversion member 70 is placed on the upper surface of the light-transmissive resin constituting the light-transmissive member 60 in an uncured state as shown in FIG. 28. The light-transmissive resin is then cured to bond the wavelength conversion member 70 to the light-transmissive member.

For the wavelength conversion member 70, a member formed into a sheet in which a wavelength conversion material has been dispersed in a resin base material is provided. The wavelength conversion member 70 can have a multilayer structure. The multilayer wavelength conversion member can contain different types of wavelength conversion materials such as phosphors in different layers. Alternatively, a light-transmissive layer containing substantially no wavelength conversion material can be included.

Providing Stepped Portion(s) on Inner Surfaces of Hole Portions 56 of Light-Shielding Member 54

Figure 29:
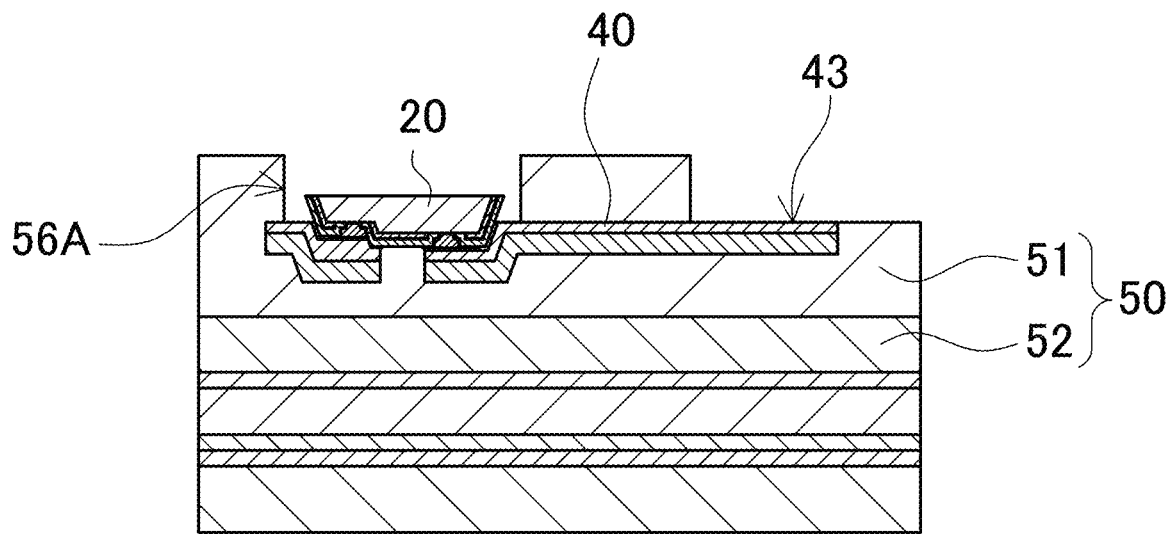
FIG. 29 is a schematic cross-sectional view illustrating an example of a step of forming a light-shielding member.

The inner surface of each hole portion 56 of the light-shielding member 54 can have one or more stepped portions as shown in FIG. 6 instead of being flat as described above. A process of providing stepped portions on inner surfaces of the hole portions of the light-shielding member 54 is described with reference to FIG. 29 to FIG. 33. Similarly to the step described above, the covering members 31 are formed, the light-shielding member 54 is disposed, and the covering members 31 are removed to form hole portions 56A as shown in FIG. 29. Only a single hole portion 56A is shown for the purpose of illustration, but actually a plurality of hole portions 56A are formed on the composite board 50. Only a single structure is hereinafter shown in the drawings, but a plurality of members are formed on or removed from the composite board 50 in substantially the same manner.

Figure 30:
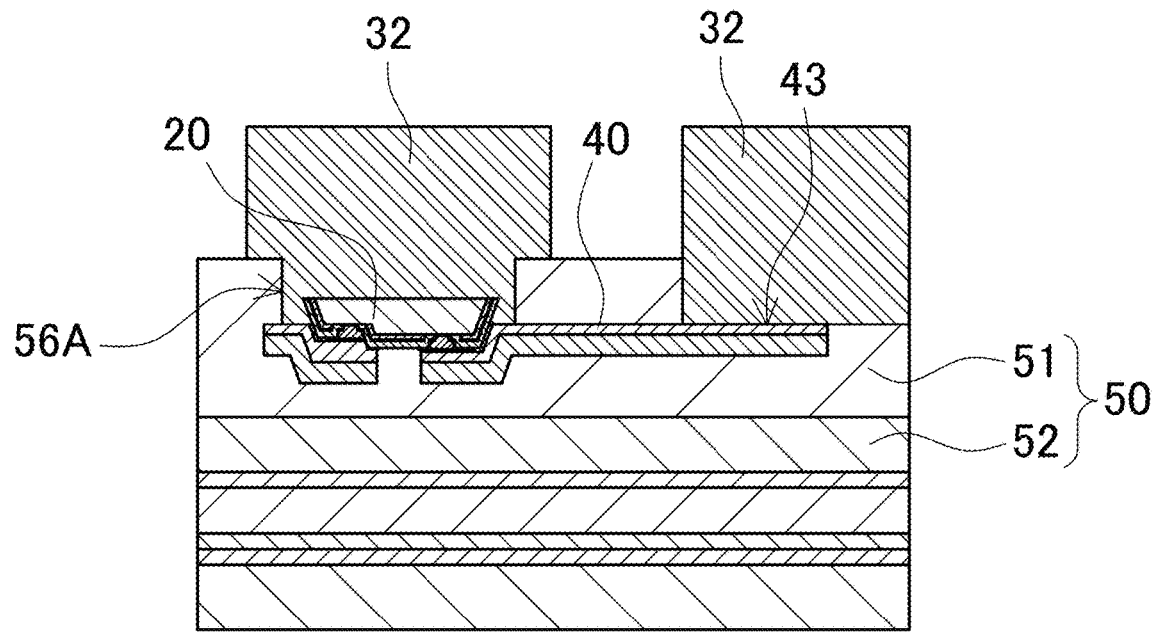
FIG. 30 is a schematic cross-sectional view illustrating the example of the step of forming the light-shielding member.

Subsequently, second covering members 32 are formed as shown in FIG. 30. Each second covering member 32 covers the vicinity of the hole portion 56A on the upper surface of the light-shielding member 54 continuously from the hole portion 56A. Such second covering members 32 are formed apart from each other for the respective hole portions 56A. Substantially the same material as for the first covering layer 30 or the covering members 31 described above can be used for the second covering members 32.

Figure 31:
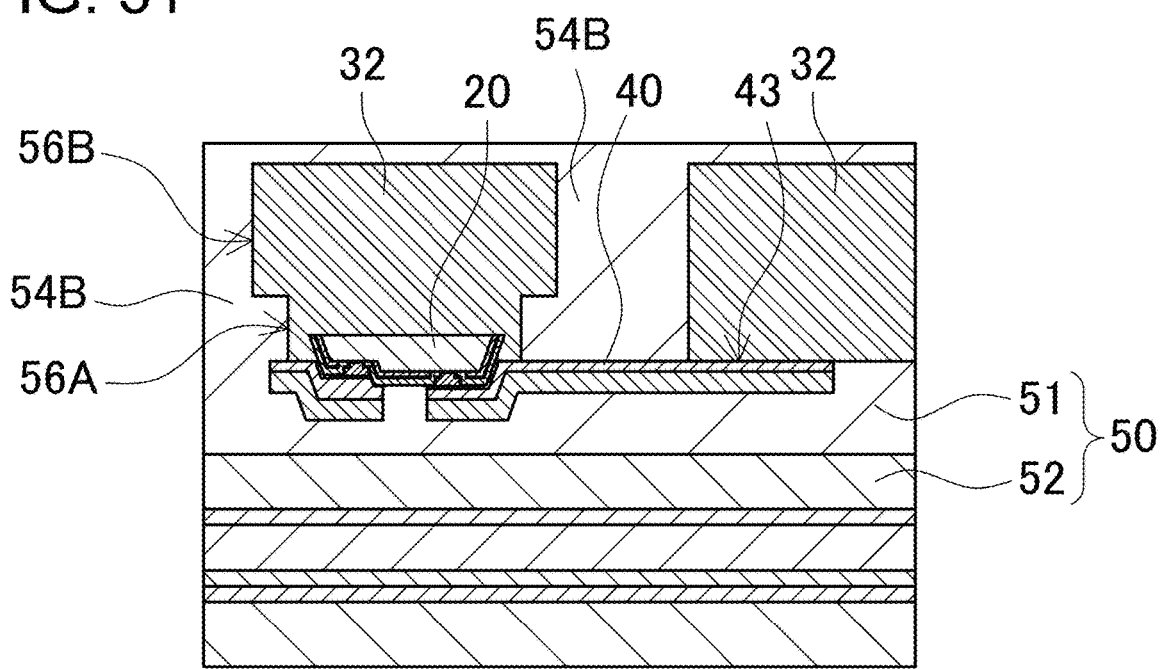
FIG. 31 is a schematic cross-sectional view illustrating the example of the step of forming the light-shielding member.
Figure 32:
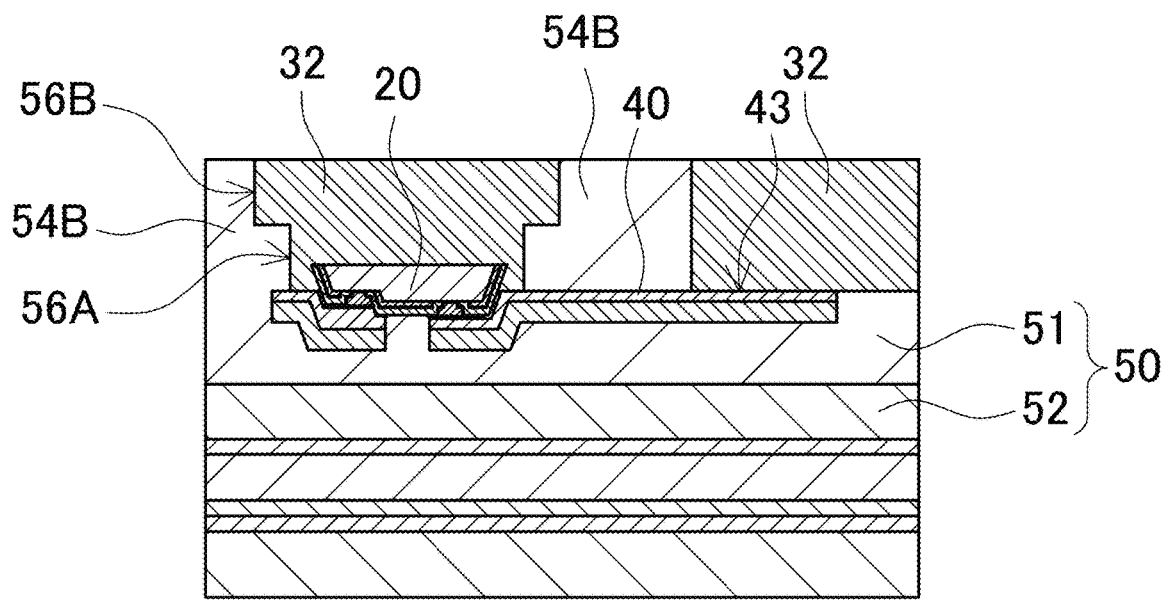
FIG. 32 is a schematic cross-sectional view illustrating the example of the step of forming the light-shielding member.

Further, a second light-shielding member 54B is disposed as shown in FIG. 31. The second light-shielding member 54B is formed up to the upper surfaces of the second covering members 32 such that the gaps between the second covering members are filled. The upper surface of the second light-shielding member 54B is then eliminated to expose the second covering members 32 as shown in FIG. 32. Substantially the same material as for the light-shielding member 54 described above can be used for the second light-shielding member 54B.

Figure 33:
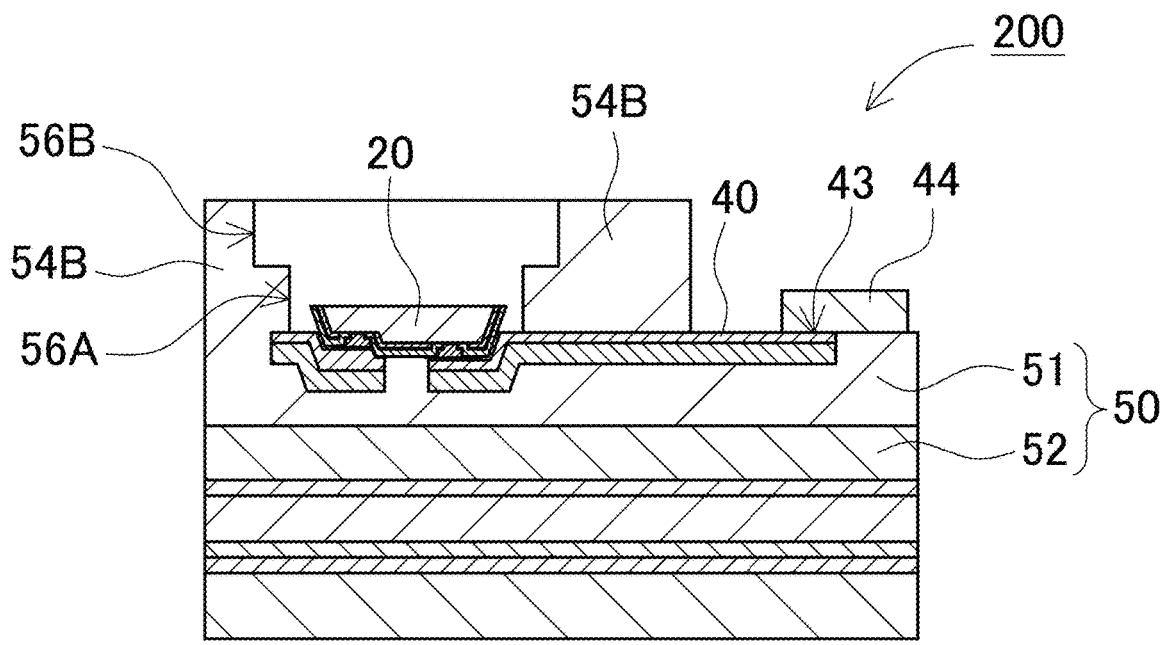
FIG. 33 is a schematic cross-sectional view illustrating the example of the step of forming the light-shielding member.

The second covering member 32 is then removed. The hole portion 56B having a stepped portion at the open end of the hole portion 56A is thus formed as shown in FIG. 33.

The number of stepped portions can be increased by repeating such a process.

Figure 34:
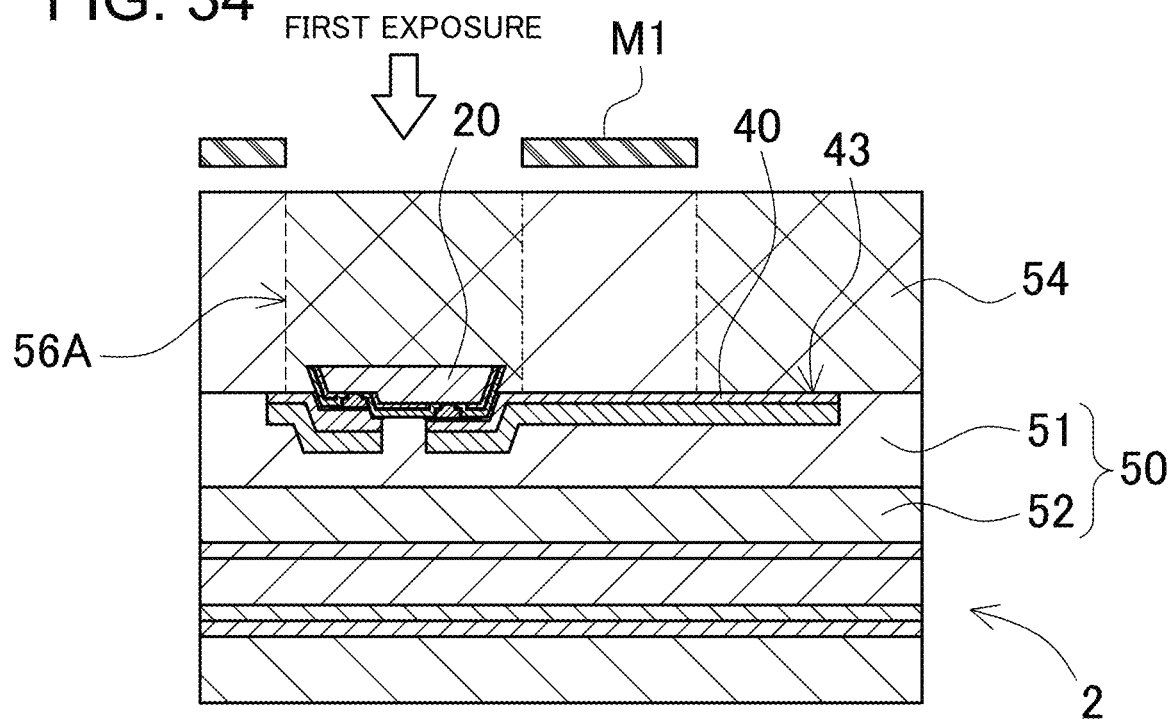
FIG. 34 is a schematic cross-sectional view illustrating an example of the step of forming the light-shielding member.

Alternatively, the stepped portion can be provided by changing the intensity and pattern of light exposure at the time of etching such as RIE. Such an example is described with reference to FIG. 34 and FIG. 35. First, similarly to the steps described above referring to the drawings of up to FIG. 20, a light-reflective resin constituting the light-shielding member 54 is applied to the entire surface of the provided intermediate structure body 2, in which the light-emitting elements 20 are disposed on the composite board 50. Exposure to light (first exposure) is performed for the first time through a first mask M1 in this state as shown in FIG. 34. The opening area of the first mask M1 is designed to be equal to the opening area of the hole portion 56A. The intensity of the first exposure is set to such an intensity that the light-reflective resin (light-shielding member 54) on the composite board 50 can be entirely removed by etching, that is, a relatively high intensity of light exposure.

Figure 35:
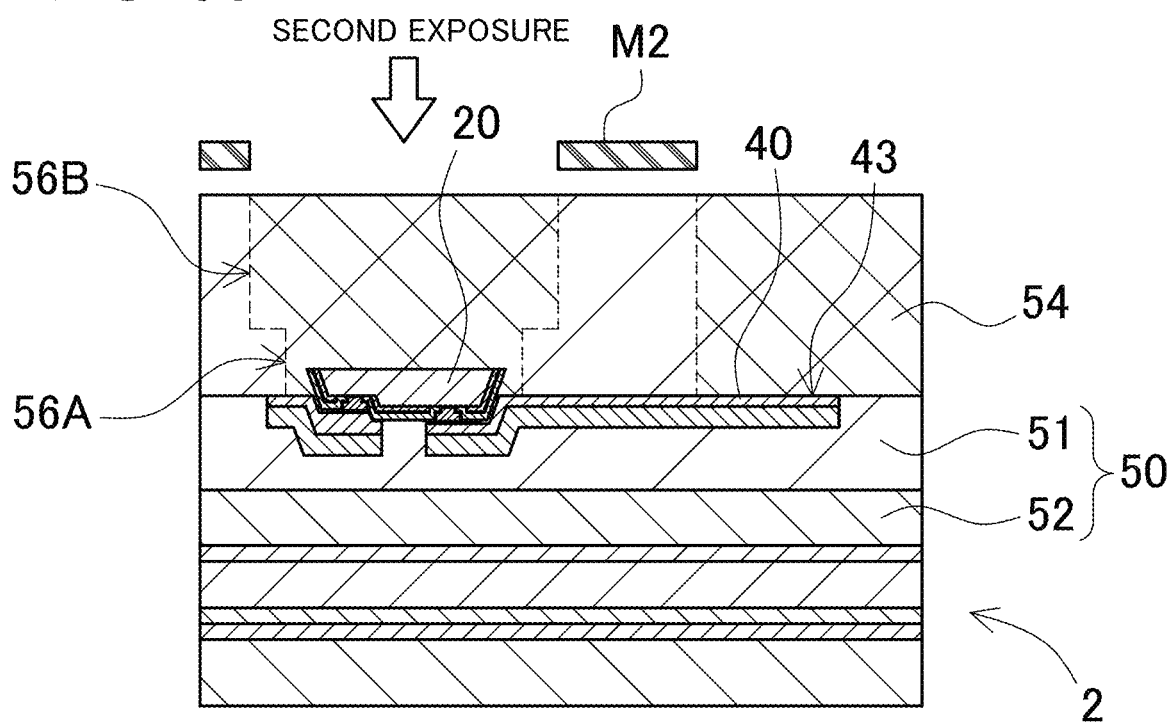
FIG. 35 is a schematic cross-sectional view illustrating the example of the step of forming the light-shielding member.

Subsequently, the mask is changed to a second mask M2, and continuous exposure to light is performed. The opening area of the second mask M2 used for the exposure to light for the second time (second exposure) is designed to be equal to the opening area of the hole portion 56B, which is larger than the opening area of the hole portion 56A, as shown in FIG. 35. The intensity of the second exposure is set to be lower than the intensity of the first exposure such that the hole portion 56A is left, that is, such that the light-shielding member 54 with a thickness equal to the depth of the hole portion 56A is left. The hole portion 56A and the hole portion 56B are thus formed in the light-shielding member 54, so that the surface light source 200 including the light-shielding member 54 having stepped portions as shown in FIG. 32 is obtained.

Fourth Embodiment

Figure 36:
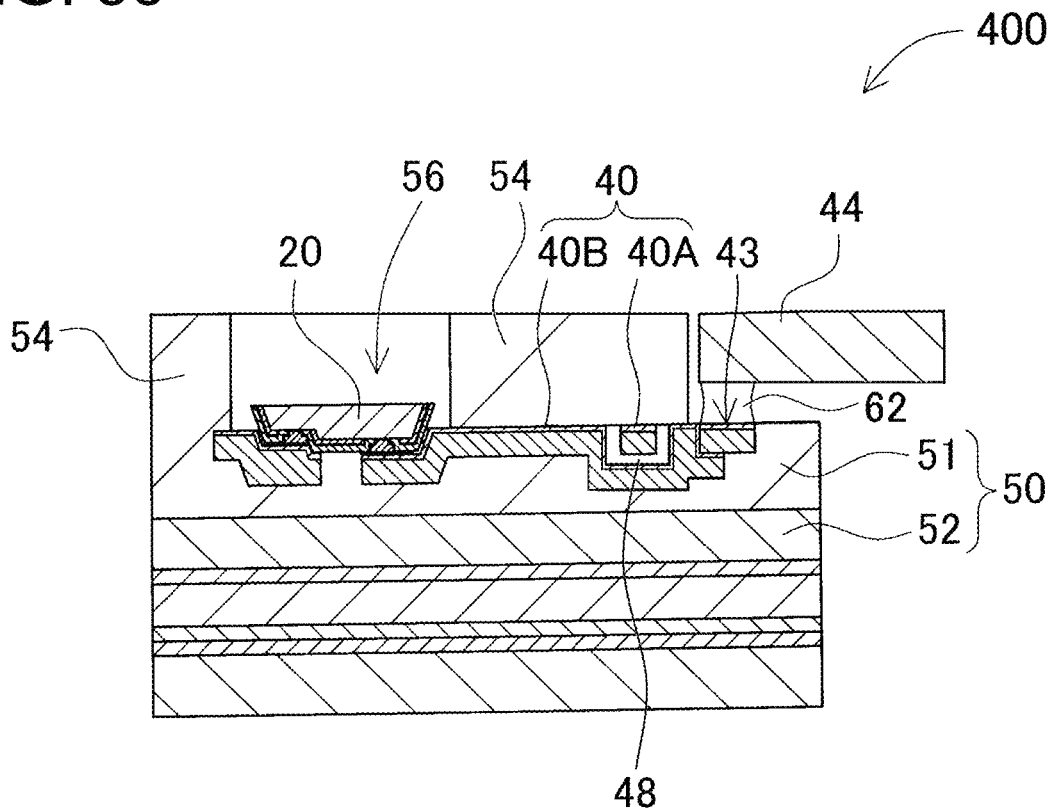
FIG. 36 is a schematic enlarged cross-sectional view of a main part of a surface light source according to a fourth embodiment.

In an example of a surface light source 400 according to a fourth embodiment shown in FIG. 36, the surface light source 400 includes an intersection portion of a first wiring layer 40A and a second wiring layer 40B intersect each other in three dimensions with an insulating member 48 interposed therebetween. The first wiring layer 40A and the second wiring layer 40B are connected to the positive and negative element electrodes 21 of the light-emitting element 20. The insulating member 48 is disposed at least in a region in which the first wiring layer 40A and the second wiring layer 40B overlap with each other in a top view so as to lie between the first wiring layer 40A and the second wiring layer 40B. For the insulating member 48, a photosensitive insulating resin commonly used for an interlayer insulating film for multilayer wiring, such as a photosensitive acrylic resin, a photosensitive silicone resin (such as SINR-3170 manufactured by Shin-Etsu Chemical Co., Ltd.), a photosensitive epoxy resin, and a photosensitive polyimide, can be used. The light-shielding member 54 covers the upper surfaces of the supporting member 51, the insulating member 48, the first wiring layer 40A, and the second wiring layer 40B. The light-shielding member 54 has a plurality of hole portions 56. In each of the hole portions 56, the light-emitting element 20 is connected to the wiring layer 40. FIG. 36 does not show the light-transmissive member 60, but the light-transmissive member 60 can be disposed in the hole portion 56. The present embodiment can allow for the layout of wiring in which the first wiring layer 40A and the second wiring layer 40B intersect each other, so that a circuit required for local dimming can be easily formed.

Fifth Embodiment

Figure 37:
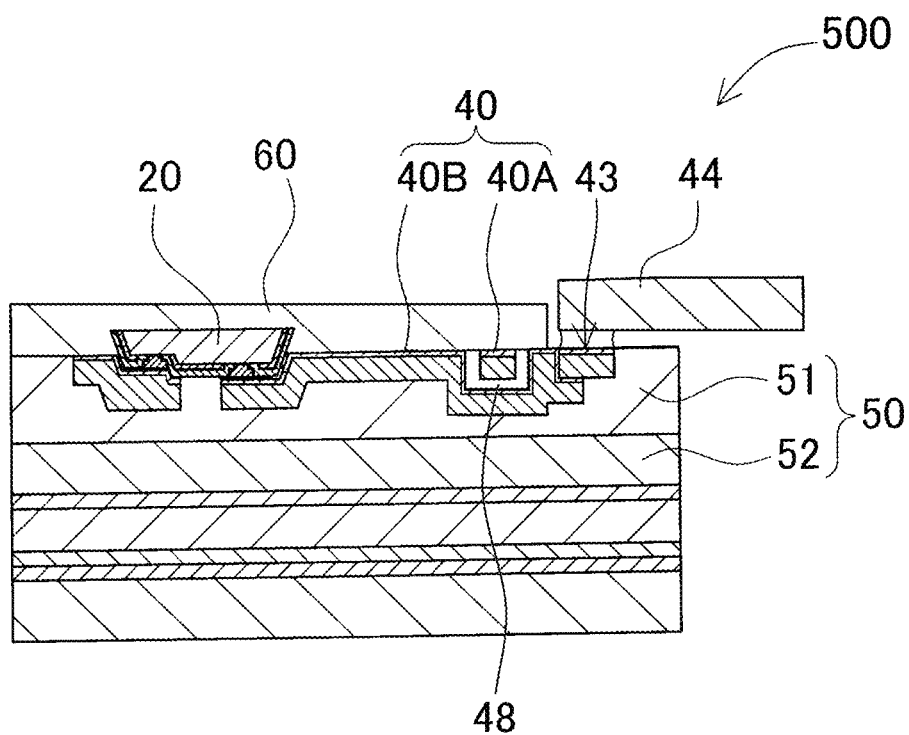
FIG. 37 is a schematic enlarged cross-sectional view of a main part of a surface light source according to a fifth embodiment.

In an example of a surface light source 500 according to a fifth embodiment shown in FIG. 37, the light-transmissive member 60 is disposed over the light-emitting element 20, the supporting member 51, the first wiring layer 40A, and the second wiring layer 40B. In the surface light sources 400 and 500 shown in FIG. 36 and FIG. 37, the lateral surfaces and lower surface of each of the first wiring layer 40A and the second wiring layer 40B are embedded in the supporting member 51, and the upper surfaces of the supporting member 51, the insulating member 48, the first wiring layer 40A, and the second wiring layer 40B are substantially flush with one another. The lower surface of the light-transmissive member 60 disposed on the upper surfaces of the supporting member 51, the insulating member 48, the first wiring layer 40A, and the second wiring layer 40B is substantially flat. Light emitted from the light-emitting element 20 can thus spread in the light-transmissive member 60.

Sixth Embodiment

Figure 38:
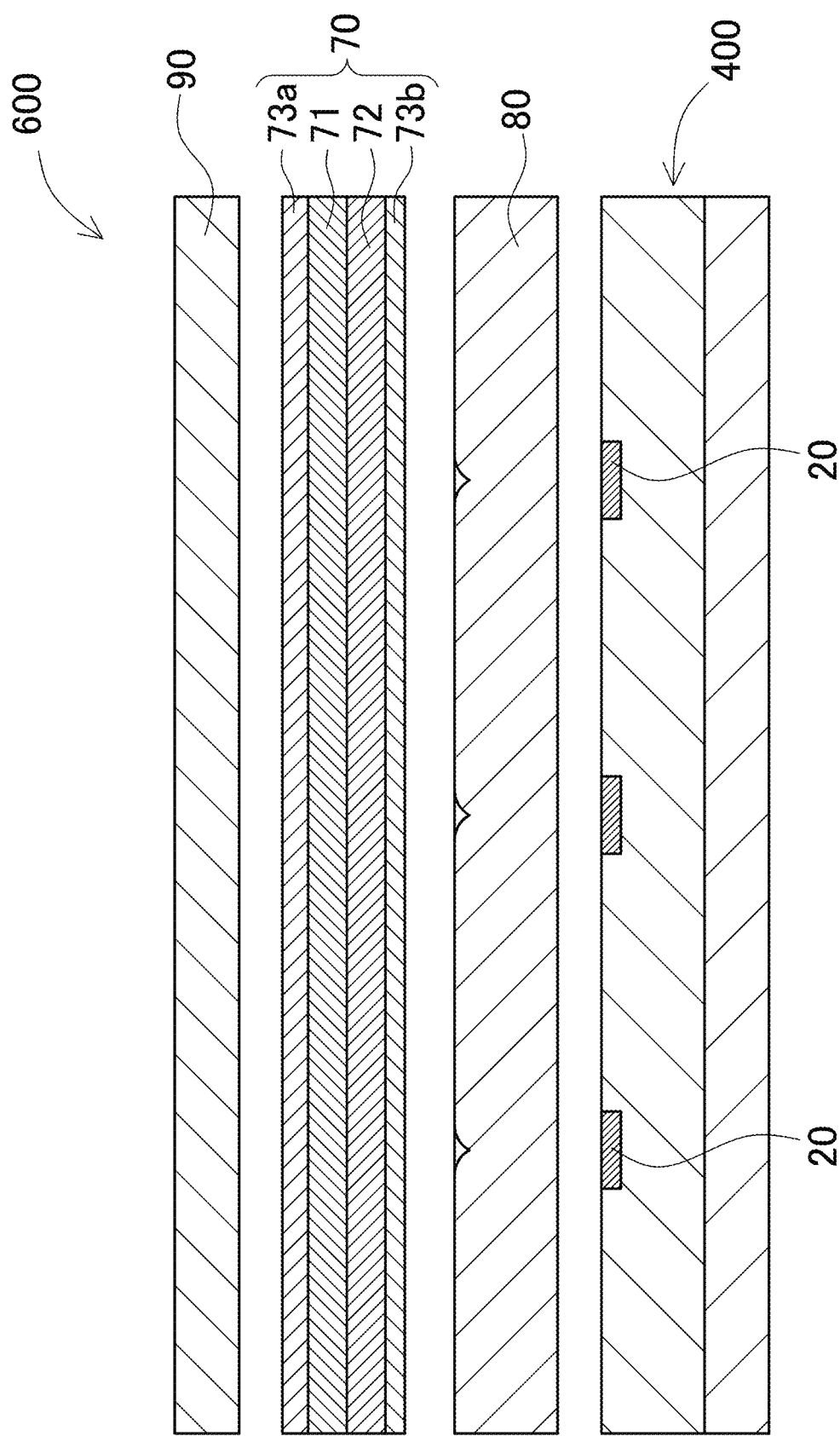
FIG. 38 is a schematic enlarged cross-sectional view of a main part of a surface light source according to a sixth embodiment.

A light-guiding plate can be added to the upper surface of the surface light source 400 shown in FIG. 36. FIG. 38 is a schematic cross-sectional view of a surface light source 600 according to a sixth embodiment, which is an example of such a constitution. In the surface light source 600 shown in FIG. 38, a light-guiding plate 80, the wavelength conversion member 70, and a prism sheet 90 are disposed on the upper surface of the surface light source 400 according to the fourth embodiment described above. This structure can allow light emitted from the emission surface of the surface light source 400 to be reflected upward and enhance the front luminance of the surface light source 600. In FIG. 38, members equivalent to members described above are indicated by the same reference numerals, and their detailed descriptions are omitted. FIG. 38 schematically shows the surface light source 400.

Figure 39:
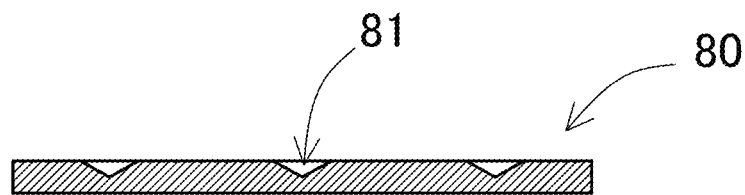
FIG. 39 is a schematic cross-sectional view of a prism sheet in FIG. 38.
Figure 40:
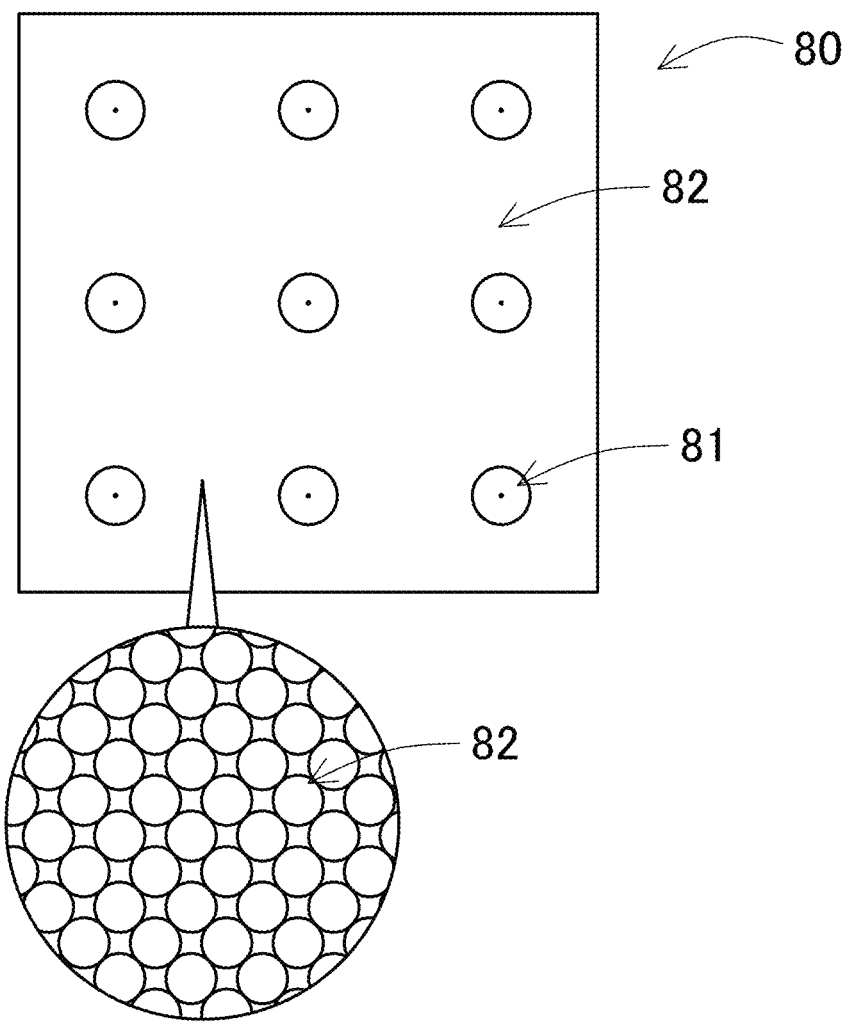
FIG. 40 is a schematic top view of the prism sheet in FIG. 39 with a schematic partial enlarged view.
Figure 41:
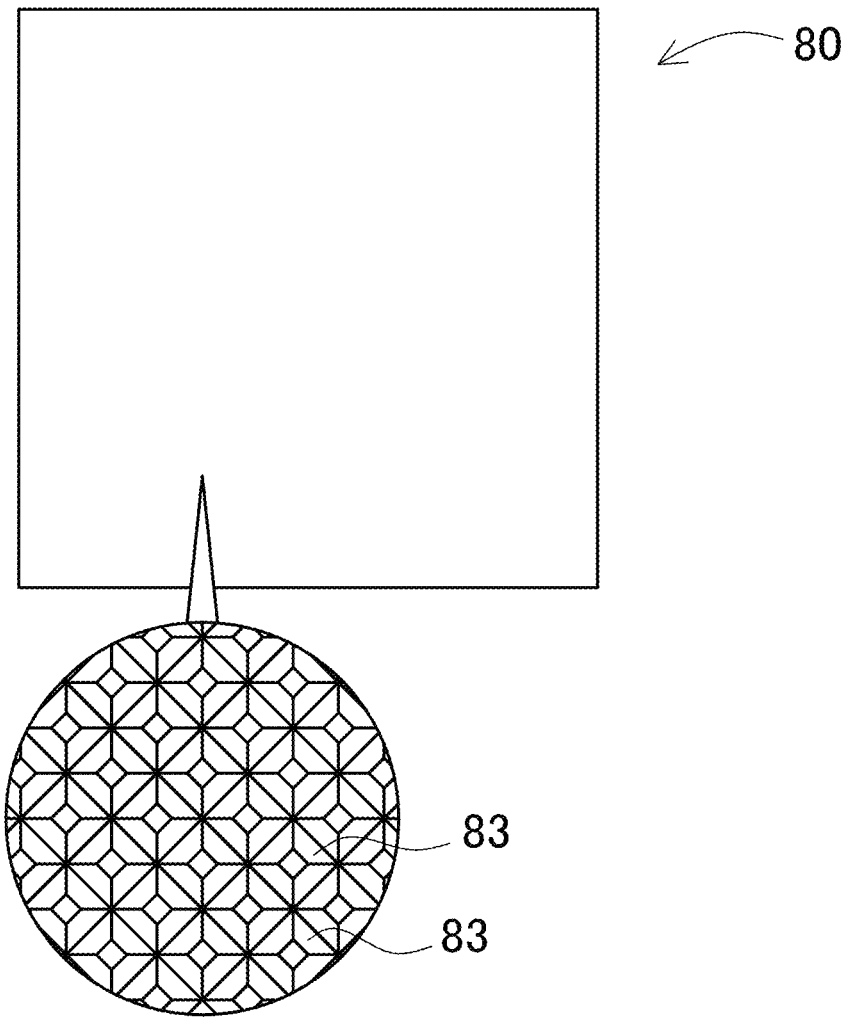
FIG. 41 is a schematic bottom view of the prism sheet in FIG. 39 with a schematic partial enlarged view.

FIG. 39, FIG. 40, and FIG. 41 are a schematic cross-sectional view, a schematic top view with a schematic partial enlarged view, and a schematic bottom view with a schematic partial enlarged view, respectively, of the light-guiding plate 80. The upper surface of the light-guiding plate 80 shown in FIG. 39, FIG. 40, and FIG. 41 has a plurality of first recesses 81. The first recesses 81 are located almost directly above the respective light-emitting elements 20. Each of the first recesses 81 can have, for example, the shape of an inverted truncated cone.

A plurality of projections 82 are located in a region of the upper surface of the light-guiding plate 80 where the first recesses 81 does not overlap. The projections 82 are preferably located at regular intervals. Each of the projections 82 has a circular shape in a top view as shown in the schematic partial enlarged view of FIG. 40. The circular projection 82 has a diameter of, for example, 10 μm or more and 300 μm or less. The projection 82 can reduce total reflection within the light-guiding plate 80. This can increase light to be extracted from the upper surface.

Such a projection 82 can have any of various shapes such as hemispherical, conical, pyramidal, and truncated pyramidal shapes in a vertical cross-sectional view. Recesses can be formed instead of the projections 82. In this case, each of the recesses can have a circular shape in a top view, while in a cross-sectional view, the recess can have any of various shapes such as hemispherical, conical, pyramidal, and truncated pyramidal shapes.

Figure 42:
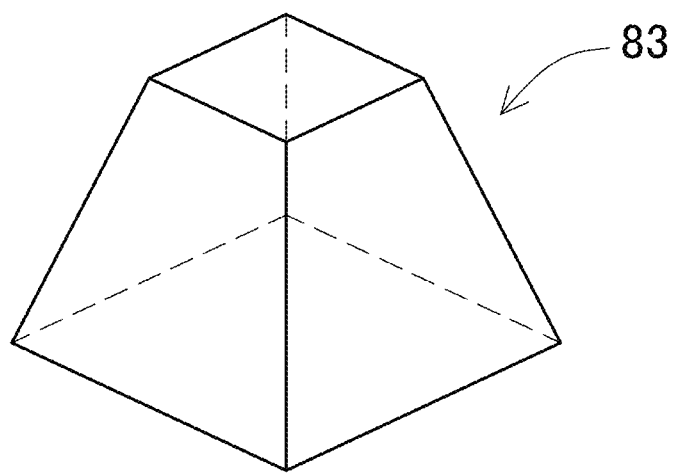
FIG. 42 is a schematic enlarged perspective view of a prism of the prism sheet in FIG. 41.

The entire lower surface of the light-guiding plate 80 has a plurality of second recesses 83 smaller than the disposition pitch of the light-emitting elements 20 as shown in the schematic bottom view of FIG. 41. Each of the second recesses 83 has the shape of a frustum of a quadrangular pyramid as shown in the schematic enlarged perspective view of FIG. 42. A large number of such second recesses 83 are obliquely provided such that the square bottom surface of each second recess 83 is rotated 45° as shown in the schematic partial enlarged view of FIG. 41. The opening width of the second recess 83 can be about 0.5 μm or more and 10 μm or less.

Adding such a light-guiding plate 80 having a plurality of projections 82, first recesses 81, and/or second recesses 83 allows for diffusion of light from the surface light source 400.

The wavelength conversion member 70 can have the same structure as shown in FIG. 3 and other drawings. In the example shown in FIG. 38, the wavelength conversion member 70 can be a layered sheet in which light-transmissive protective films 73a and 73b cover both surfaces of a layered body of a first wavelength conversion member 71 and a second wavelength conversion member 72 in the form of sheets. For example, PET can be used for the protective films 73a and 73b. A dichroic mirror can be added to the lower surface of the first wavelength conversion member 71. The dichroic mirror can be disposed between the first wavelength conversion member 71 and the protective film 73a. The dichroic mirror can replace the protective film 73a. With the added dichroic mirror as described above, light (such as yellow fluorescence) emitted from the wavelength conversion member can be suppressed from returning to the light source. This can enhance the light extraction efficiency and reducing uneven coloring.

In the example shown in FIG. 38, a red phosphor such as a KSF phosphor is used for a wavelength conversion substance contained in the first wavelength conversion member 71, and a green phosphor such as a P—SiAlON phosphor is used for a wavelength conversion substance contained in the second wavelength conversion member 72.

The prism sheet 90 is a composite prism film that enhances the front luminance of a liquid-crystal display. For example, brightness enhancement films (ASOC4, DBEF, and BEF) manufactured by the 3M Company can be used for such a prism sheet 90.

The surface light source in the present disclosure can be employed for a backlight device of a television or a tablet device, or a liquid-crystal display device and can be suitably used for a television, a tablet device, a smartphone, a smartwatch, a head-up display, digital signage device, or a bulletin board. The surface light source can also be employed for a light source for lighting and can be used for an emergency light, a linear lighting, various illuminations, or in-vehicle components.

What is claimed is:

1. A method of manufacturing a surface light source, the method comprising:
   providing an intermediate structure body, the intermediate structure body comprising:
      a composite board comprising a supporting member and a wiring layer disposed on the supporting member; and
      a plurality of light-emitting elements disposed apart from each other on the wiring layer of the composite board;
   disposing a plurality of covering members apart from each other to directly cover upper surfaces and lateral surfaces of the light-emitting elements and portions of the composite board around the light-emitting elements;
   disposing a light-shielding member such that a gap between the covering members is filled;
   removing the covering members to expose substantially all the upper surfaces and lateral surfaces of the light-emitting elements to form a plurality of hole portions; and
   disposing a light-transmissive member in the hole portions.

2. The method of manufacturing a surface light source according to claim 1, wherein the step of removing the covering members comprises removing the covering members by dry etching.

3. The method of manufacturing a surface light source according to claim 1,
   wherein the wiring layer comprises a terminal portion connected to an external member, and
   wherein the step of disposing the plurality of covering members comprises disposing the covering members to cover the terminal portion.

4. The method of manufacturing a surface light source according to claim 1, wherein the step of disposing the light-transmissive member comprises disposing the light-transmissive member such that the hole portions are filled and an upper surface of the light-shielding member is embedded in the light-transmissive member.

5. The method of manufacturing a surface light source according to claim 1, further comprising, after the step of disposing the light-transmissive member, disposing a wavelength conversion member over the light-transmissive member and the light-shielding member, the wavelength conversion member being configured to convert light emitted from the light-emitting elements into light with a different wavelength.

6. The method of manufacturing a surface light source according to claim 1,
   wherein the step of disposing the light-shielding member comprises disposing the light-shielding member to cover upper surfaces of the covering members continuously from the gap between the covering members, and
   wherein the method of manufacturing a surface light source further comprises, after the step of disposing the light-shielding member, exposing the covering members by partially removing a surface of the light-shielding member.

7. The method of manufacturing a surface light source according to claim 1, wherein the step of disposing the light-shielding member comprises disposing a resin containing a light-reflective substance.

8. The method of claim 1, wherein in the step of removing the covering members, the covering members are removed to expose all the upper surfaces and lateral surfaces of the light-emitting elements to form a plurality of hole portions.

9. A method of manufacturing a surface light source, the method comprising:
   providing an intermediate structure body, the intermediate structure body comprising:
      a composite board comprising a supporting member and a wiring layer disposed on the supporting member; and
      a plurality of light-emitting elements disposed apart from each other on the wiring layer of the composite board;
   disposing a plurality of covering members apart from each other to cover upper surfaces and lateral surfaces of the light-emitting elements and portions of the composite board around the light-emitting elements;
   disposing a light-shielding member such that a gap between the covering members is filled;
   removing the covering members to form a plurality of hole portions;
   disposing a plurality of second covering members apart from each other to partially cover an upper surface of the light-shielding member continuously from the hole portions;
   disposing a second light-shielding member such that a gap between the second covering members is filled;
   removing the second covering members to form a plurality of other hole portions having stepped portions at open ends of the hole portions; and
   disposing a light-transmissive member in the hole portions.

* * * * *